(12) United States Patent
Antonyan et al.

(10) Patent No.: US 10,854,289 B2
(45) Date of Patent: Dec. 1, 2020

(54) RESISTIVE MEMORY DEVICE PROVIDING REFERENCE CALIBRATION, AND OPERATING METHOD THEREOF

(71) Applicant: SAMSUNG ELECTRONICS CO., LTD., Suwon-si (KR)

(72) Inventors: Artur Antonyan, Suwon-si (KR); Hyun-Taek Jung, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/400,683

(22) Filed: May 1, 2019

(65) Prior Publication Data
US 2019/0348096 A1 Nov. 14, 2019

(30) Foreign Application Priority Data

May 14, 2018 (KR) .................. 10-2018-0055046
Sep. 17, 2018 (KR) .................. 10-2018-0111020

(51) Int. Cl.
*G11C 13/00* (2006.01)
*G11C 11/16* (2006.01)
*G11C 29/02* (2006.01)

(52) U.S. Cl.
CPC .......... *G11C 13/004* (2013.01); *G11C 11/161* (2013.01); *G11C 11/1673* (2013.01); *G11C 29/028* (2013.01); *G11C 2013/0054* (2013.01)

(58) Field of Classification Search
CPC . G11C 11/161; G11C 11/1673; G11C 13/004; G11C 29/021; G11C 29/028; G11C 2013/0054
See application file for complete search history.

(56) References Cited

U.S. PATENT DOCUMENTS

| | | | |
|---|---|---|---|
| 6,018,172 A * | 1/2000 | Hidaka | ............. H01L 27/10882 257/296 |
| 6,856,532 B2 | 2/2005 | Baker | |
| 7,239,537 B2 | 7/2007 | DeBrosse et al. | |
| 7,729,165 B2 | 6/2010 | Wang | |
| 7,813,166 B2 | 10/2010 | Jung et al. | |
| 7,863,876 B2 | 1/2011 | Cook et al. | |
| 8,213,215 B2 | 7/2012 | Chen et al. | |
| 8,295,076 B2 | 10/2012 | Jeon et al. | |
| 8,693,273 B2 | 4/2014 | Yuh et al. | |
| 8,842,467 B2 | 9/2014 | Oh | |

(Continued)

*Primary Examiner* — Vanthu T Nguyen
(74) *Attorney, Agent, or Firm* — F. Chau & Associates, LLC

(57) ABSTRACT

A resistive memory device configured to calibrate a reference resistor includes a calibration resistor circuit including a calibration resistor, a first reference resistor, a first sense amplifier configured to compare input currents, a first switch set including a plurality of switches, and a controller configured to control the first switch set to allow the first sense amplifier to compare a first reference current passing through the first reference resistor with a first read current passing through a first memory cell during a read operation and compare the first reference current with a first calibration current passing through the calibration resistor during a calibrate operation. A path of the first reference current during the read operation is different from a path of the first reference current during the calibrate operation.

18 Claims, 17 Drawing Sheets

(56) References Cited

U.S. PATENT DOCUMENTS

| | | | |
|---|---|---|---|
| 8,912,818 B2 | 12/2014 | Bhakta et al. | |
| 8,917,536 B2 | 12/2014 | Jan et al. | |
| 8,923,040 B2 | 12/2014 | Lin et al. | |
| 8,929,127 B2 * | 1/2015 | Antonyan | G11C 11/1675 365/148 |
| 9,390,779 B2 | 7/2016 | Jung et al. | |
| 9,406,367 B2 | 8/2016 | Chih et al. | |
| 9,437,257 B2 * | 9/2016 | Yang | G11C 7/062 |
| 9,472,246 B2 | 10/2016 | Priel et al. | |
| 9,520,173 B1 * | 12/2016 | Baker, Jr. | G11C 11/1675 |
| 9,660,647 B2 | 5/2017 | Chern et al. | |
| 9,767,875 B2 * | 9/2017 | Roy | G11C 11/1673 |
| 9,779,795 B1 | 10/2017 | Sadd et al. | |
| 10,170,162 B2 * | 1/2019 | Al-Shamma | G11C 7/08 |
| 2006/0092689 A1 | 5/2006 | Braun et al. | |
| 2017/0322840 A1 | 11/2017 | Kinney et al. | |
| 2018/0122462 A1 | 5/2018 | Lee | |

* cited by examiner

RESISTIVE MEMORY DEVICE PROVIDING REFERENCE CALIBRATION, AND OPERATING METHOD THEREOF

CROSS-REFERENCE TO RELATED APPLICATIONS

This application claims priority under 35 U.S.C. § 119 to Korean Patent Application Nos. 10-2018-0055046 and 10-2018-0111020, respectively filed on May 14, 2018 and Sep. 17, 2018 in the Korean Intellectual Property Office, the disclosures of which are incorporated by reference herein in their entireties.

TECHNICAL FIELD

Exemplary embodiments of the inventive concept relate to a resistive memory device, and more particularly, to a resistive memory device providing reference calibration, and an operating method of the resistive memory device.

DISCUSSION OF RELATED ART

Resistive memory devices are capable of storing data in a memory cell including a variable resistance element. To detect data stored in the memory cell of a resistive memory device, for example, a read current or read voltage may be provided to the memory cell, and a corresponding read voltage or read current changed by the variable resistance element of the memory cell may be detected. A reference resistance that is used to determine a resistance of the variable resistance element may change due to variation of processes, voltage, temperature, etc., and such change in the reference resistance may degrade reliability of a read operation in the resistive memory device.

SUMMARY

According to an exemplary embodiment of the inventive concept, a resistive memory device configured to calibrate a reference resistor may include a calibration resistor circuit including a calibration resistor, a first reference resistor, a first sense amplifier configured to compare input currents, a first switch set including a plurality of switches, and a controller configured to control the first switch set to allow the first sense amplifier to compare a first reference current passing through the first reference resistor with a first read current passing through a first memory cell during a read operation and compare the first reference current with a first calibration current passing through the calibration resistor during a calibrate operation. A path of the first reference current during the read operation may be different from a path of the first reference current during the calibrate operation.

According to an exemplary embodiment of the inventive concept, a resistive memory device configured to calibrate a plurality of reference resistors may include a calibration resistor, a plurality of reference resistors, a plurality of sense amplifiers each configured to compare a reference current passing through one of the plurality of reference resistors with a read current passing through a memory cell during a read operation, and compare the reference current with a calibration current passing through the calibration resistor, and a plurality of switches configured to form a second path during a calibrate operation to allow the reference current to pass through the second path. The second path may have substantially the same length as a first path through which the calibration current passes between the plurality of sense amplifiers and the calibration resistor.

According to an exemplary embodiment of the inventive concept, a resistive memory device configured to calibrate a plurality of reference resistors may include a calibration resistor, a plurality of read circuits each configured to compare a reference current passing through one of a plurality of reference resistors with a read current passing through a memory cell during a read operation, and compare the reference current with a calibration current passing through the calibration resistor during a calibrate operation, a first conductive line connected to the plurality of read circuits and the calibration resistor, and configured to allow the calibration current to pass therethrough during the calibrate operation, and a second conductive line connected to the plurality of read circuits, and configured to allow the reference current to pass therethrough during the calibrate operation. The first conductive line and the second conductive line may have substantially the same length as each other.

According to an exemplary embodiment of the inventive concept, a resistive memory device configured to calibrate a reference resistor may include a calibration resistor circuit comprising a calibration resistor, a first reference resistor, a first sense amplifier including a first input end and a second input end, a first conductive line and a second conductive line connected to the calibration resistor circuit, and a switch set comprising a first switch and a second switch. The second input end of the first sense amplifier may be connected to the first reference resistor. The first switch may be configured to connect the first input end of the first sense amplifier to the calibration resistor via the first conductive line. The second switch may be configured to connect the first reference resistor with the second conductive line.

BRIEF DESCRIPTION OF THE DRAWINGS

The above and other features of the inventive concept will be more clearly understood by describing in detail exemplary embodiments thereof with reference to the accompanying drawings.

DETAILED DESCRIPTION OF THE EMBODIMENTS

Figure 1:
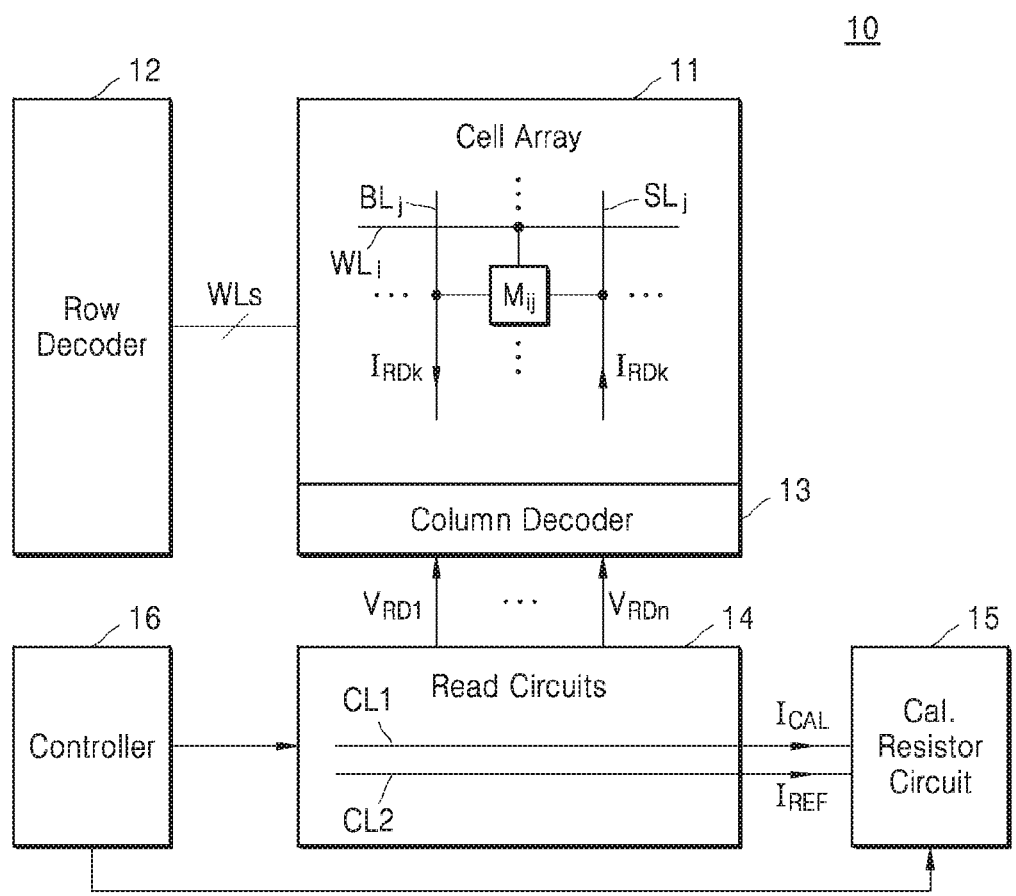
FIG. 1 is a block diagram illustrating a memory device according to an exemplary embodiment of the inventive concept.

Exemplary embodiments of the inventive concept provide a resistive memory device, and more particularly, a resistive memory device capable of accurately reading a value stored in a memory cell by providing accurate reference calibration, and an operating method of the resistive memory device.

Exemplary embodiments of the inventive concept will be described more fully hereinafter with reference to the accompanying drawings. Like reference numerals may refer to like elements throughout this application.

FIG. 1 is a block diagram illustrating a memory device according to an exemplary embodiment of the inventive concept. In particular, FIG. 1 shows a cell array 11, a row decoder 12, a column decoder 13, read circuits 14, a calibration resistor circuit 15, and a controller 16, which are some elements included in a memory device 10.

The memory device 10 may externally receive a command and an address and may receive or output data. For example, the memory device 10 may receive a command such as a write command or a read command and an address corresponding to the command. The memory device 10 may receive data in response to the write command and may output data in response to the read command. In exemplary embodiments of the inventive concept, the command, the address, and the data may be received or transmitted via independent channels. In exemplary embodiments of the inventive concept, at least two of the command, the address, and the data may be received or transmitted via the same channel.

The cell array 11 may include a plurality of memory cells (e.g., $M_{ij}$). A memory cell $M_{ij}$ may include a variable resistance element (e.g., MTJ of FIG. 2), and the variable resistance element may have a resistance corresponding to a value stored in the memory cell $M_{ij}$. Accordingly, the memory device 10 may be referred to as a resistive memory device or a resistive random access memory (RRAM) (or ReRAM) device. For example, the memory device 10, as non-limiting examples, may include the cell array 11 having the structure of phase-change random access memory (PRAM), ferroelectric random access memory (FRAM), etc., and in exemplary embodiments of the inventive concept, may include the cell array 11 having the structure of magnetic random access memory (MRAM) such as spin-transfer torque magnetic random access memory (STT-MRAM), spin torque transfer magnetization switching RAM (Spin-RAM), or spin momentum transfer RAM (SMT-RAM). Although, as will be described below with reference to FIGS. 2 and 3, exemplary embodiments of the inventive concept will be mainly described with reference to MRAM, it should be noted that the inventive concept is not limited thereto.

As illustrated in FIG. 1, the memory cell $M_{ij}$ may be connected to a word line $WL_i$ and may be connected to a source line $SL_j$ and a bit line $BL_j$. To detect a resistance of the variable resistance element included in the memory cell $M_{ij}$ during a read operation, in exemplary embodiments of the inventive concept, a voltage generated in the memory cell $M_{ij}$ may be detected by applying a predetermined current to the memory cell $M_{ij}$. In exemplary embodiments of the inventive concept, a current generated in the memory cell $M_{ij}$ may be detected by applying a predetermined voltage to the memory cell $M_{ij}$. In exemplary embodiments of the inventive concept, a current and a voltage may both be detected.

Although exemplary embodiments of the inventive concept will be described below mainly with reference to an operation of detecting a current generated in the memory cell $M_{ij}$, e.g., a read current (e.g., $I_{RDk}$), by applying a predetermined voltage, e.g., a read voltage (e.g., $V_{RD1}$ to $V_{RDn}$), to the memory cell $M_{ij}$ during a read operation, it will be understood that the inventive concept is not limited thereto.

The row decoder 12 may activate one of a plurality of word lines WLs according to an address received together with the read command, and memory cells connected to the activated word line may be selected. For example, when the word line $WL_i$ is activated, the memory cell $M_{ij}$ may be selected, and the read current $I_{RDk}$ may flow from the source line $SL_j$ through the memory cell $M_{ij}$ to the bit line $BL_j$. In exemplary embodiments of the inventive concept, memory cells selected by one word line or data stored in such memory cells may be referred to as a page.

The column decoder 13 may select some of memory cells connected to an activated word line $WL_i$ according to an address received together with the read command. For example, n memory cells may be selected from among memory cells connected to the word line $WL_i$ (where n is a positive integer), and the selected n memory cells may be connected to the read circuits 14 through source lines and bit lines.

The read circuits 14 may provide read voltages $V_{RD1}$ to $V_{RDn}$ to n memory cells during a read operation. For example, a $k^{th}$ read circuit from among the read circuits 14 may provide the read voltage $V_{RDk}$ to the memory cell $M_{ij}$ (where $1 \leq k \leq n$), and accordingly, the read current $I_{RDk}$ passing through the memory cell $M_{ij}$ may be generated. The $k^{th}$ read circuit may detect a resistance of the variable resistance element included in the memory cell $M_{ij}$, based on the read current $I_{RDk}$, and may output a signal corresponding to the detected resistance.

In exemplary embodiments of the inventive concept, the $k^{th}$ read circuit may detect a resistance of the variable resistance element by comparing a size of the read current $I_{RDk}$ with a size of a reference current, and accordingly, when the size of the reference current changes, a value read from the memory cell $M_{ij}$ may include an error. Although FIG. 1 illustrates only the read circuits 14, the memory device 10 may further include a write circuit that provides a write current and/or a write voltage to the memory cell $M_{ij}$, and in exemplary embodiments of the inventive concept, may include a write/read circuit having a write circuit and a read circuit implemented as one block.

As will be described below with reference to FIGS. 5A and 5B, each of the read circuits 14 may include a reference resistor for generating the reference current. Reference resistors included in the read circuits 14 may have different resistances due to variation of processes, voltage, temperature, etc. To have a desired resistance (e.g., a reference resistance) by such reference resistors, the memory device 10 may include the calibration resistor circuit 15, and the controller 16 may control an operation of adjusting resistances of reference resistors to the desired resistance, e.g., an operation of calibrating reference resistors. In the present specification, an operation of adjusting resistances of the reference resistors included in the read circuits 14 may be referred to as a calibrate operation.

Figure 5A:
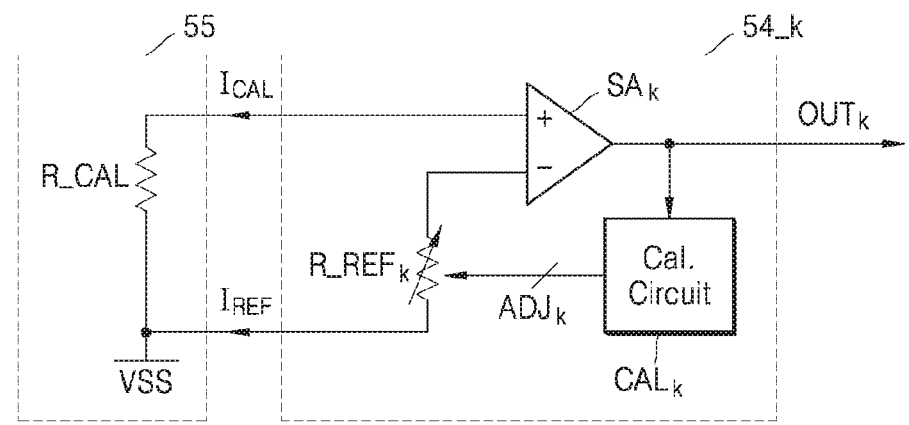
FIGS. 5A and 5B are circuit diagrams illustrating equivalent circuits of a read circuit and a surrounding circuit thereof, according to exemplary embodiments of the inventive concept.

The calibration resistor circuit 15 may include a calibration resistor (e.g., R_CAL of FIG. 5A). In addition, during the calibrate operation, the calibration resistor circuit 15 may receive a calibration current $I_{CAL}$ from the read circuits 14 through a first conductive line CL1 and may receive a reference current $I_{REF}$ from the read circuits 14 through a second conductive line CL2. The calibration current $I_{CAL}$ may pass through the calibration resistor included in the calibration resistor circuit 15, whereas the reference current $I_{REF}$ may be provided to the calibration resistor circuit 15 through the reference resistor included in one of the read circuits 14. As will be described below with reference to FIGS. 6A to 7B, the first conductive line CL1 and the second conductive line CL2 may have substantially the same structure, and a deviation between paths where the calibration current $I_{CAL}$ and the reference current $I_{REF}$ flow may decrease as the reference current $I_{REF}$ flows to the calibration resistor circuit 15 through the second conductive line CL2. Accordingly, when a size of the reference current $I_{REF}$ is matched to a size of the calibration current $I_{CAL}$, a resistance of the reference resistor may match a resistance of the calibration resistor, e.g., a calibration resistance (or a resistance including a constant offset from the calibration resistance).

As illustrated in FIG. 1, the first conductive line CL1 and the second conductive line CL2 may extend across the read circuits 14 and may have substantially the same structure as each other. In exemplary embodiments of the inventive concept, the first conductive line CL1 and the second conductive line CL2 may have substantially the same length, may be patterns formed in the same wiring layer, and/or may extend substantially parallel to each other. In addition, as will be described below with reference to FIG. 13, the first conductive line CL1 and the second conductive line CL2 may be arranged between two or more shield lines to which electrostatic potential is applied.

The controller 16 may control the read circuits 14 and the calibration resistor circuit 15. For example, the controller 16 may control the read circuits 14 so that, during a read operation, the read circuits 14 may provide the read voltages $V_{RD1}$ to $V_{RDn}$ to the cell array 11 through the column decoder 13 and may compare read currents (e.g., $I_{RDk}$) with reference currents. In addition, the controller 16 may control the read circuits 14 and the calibration resistor circuit 15 so that, during a calibrate operation, at least one of the read circuits 14 may provide the calibration current $I_{CAL}$ and the reference current $I_{REF}$ to the calibration resistor circuit 15. In exemplary embodiments of the inventive concept, the read circuits 14 may include a plurality of switches, and the controller 16 may control the plurality of switches included in the read circuits 14. In exemplary embodiments of the inventive concept, the controller 16 may include a logic block including a state machine, etc., or alternatively, may include software including a series of instructions and a processor for executing the software. Examples of the read operation and the calibrate operation will be described below with reference to FIGS. 5A and 5B.

Figure 2:
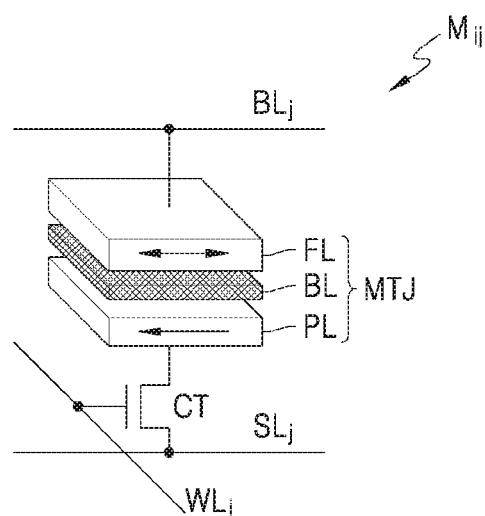
FIG. 2 is a diagram illustrating a memory cell included in a cell array of FIG. 1, according to an exemplary embodiment of the inventive concept.
Figure 3:
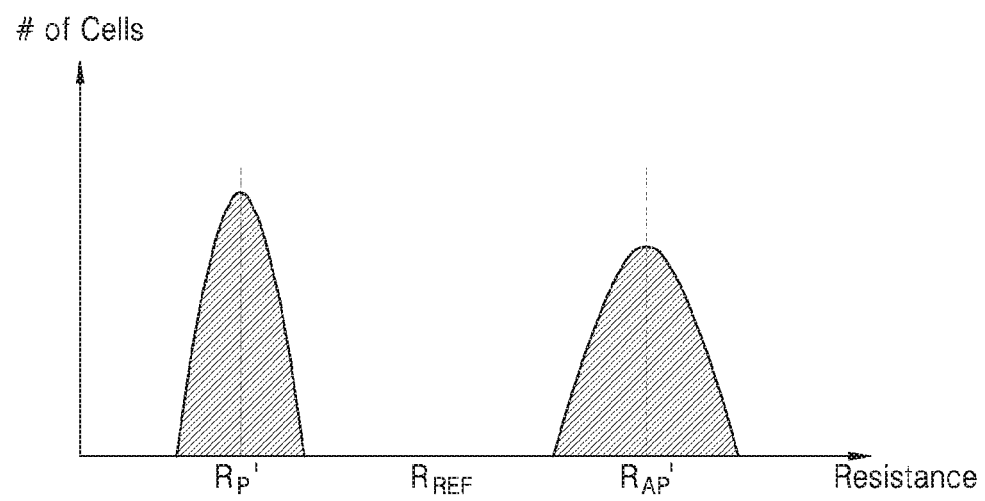
FIG. 3 is a graph illustrating a resistance distribution provided by a memory cell, according to an exemplary embodiment of the inventive concept.

FIG. 2 is a diagram illustrating a memory cell included in a cell array of FIG. 1, according to an exemplary embodiment of the inventive concept, and FIG. 3 is a graph illustrating a resistance distribution provided by the memory cell of FIG. 2, according to an exemplary embodiment of the inventive concept. In detail, FIG. 2 shows the memory cell $M_{ij}$ including a magnetic tunnel junction (MTJ) device as a variable resistance element, and FIG. 3 shows resistance distribution of the variable resistance element MTJ of FIG. 2.

As illustrated in FIG. 2, the memory cell $M_{ij}$ may include the variable resistance element MTJ and a cell transistor CT connected in series between the source line $SL_j$ and the bit line $BL_j$. In exemplary embodiments of the inventive concept, as illustrated in FIG. 2, the variable resistance element MTJ and the cell transistor CT may be connected in this stated order between the bit line $BL_j$ and the source line $SL_j$. In exemplary embodiments of the inventive concept, unlike that illustrated in FIG. 2, the cell transistor CT and the variable resistance element MTJ may be connected in this stated order between the bit line $BL_j$ and the source line $SL_j$.

The variable resistance element MTJ may include a free layer FL and a pinned layer PL and may include a barrier layer BL between the free layer FL and the pinned layer PL. As denoted by arrows in FIG. 2, while a magnetization direction of the pinned layer PL may be pinned, the free layer FL may have the same or opposite magnetization direction as or to the magnetization direction of the pinned layer PL. When the pinned layer PL and the free layer FL have magnetization directions in substantially the same direction, the variable resistance element MTJ may be referred to as being in a parallel state P. When the pinned layer PL and the free layer FL have magnetization directions in an opposite direction to each other, the variable resistance element MTJ may be referred to as being in an anti-parallel state AP. In exemplary embodiments of the inventive concept, the variable resistance element MTJ may further include an anti-ferromagnetic layer to cause the pinned layer PL to have a pinned magnetization direction.

While the variable resistance element MTJ may have a relatively low resistance $R_P$ in the parallel state P, the variable resistance element MTJ may have a relatively high resistance $R_{AP}$ in the anti-parallel state AP. In the present specification, the memory cell $M_{ij}$ is assumed to store '0' when the variable resistance element MTJ in the parallel state P has a low resistance $R_P$ and store '1' when the variable resistance element MTJ in the anti-parallel state AP has a high resistance $R_{AP}$. In addition, in the present specification, a resistance $R_P$ corresponding to '0' may be referred to as a parallel resistance $R_P$, and a resistance $R_{AP}$ corresponding to '1' may be referred to as an anti-parallel resistance $R_{AP}$.

The cell transistor CT may have a gate (or control terminal) connected to the word line $WL_i$, and a drain and a source connected to the source line $SL_j$ and the variable resistance element MTJ. The cell transistor CT may electrically connect or disconnect the variable resistance element MTJ and the source line $SL_j$ according to a voltage applied to the word line $WL_i$. For example, during a write operation, to write '0' to the memory cell $M_{ij}$, an activated word line $WL_i$ may have a positive supply voltage VDD, and accordingly, a current flowing from the bit line $BL_j$ toward the source line $SL_j$ through a turned-on cell transistor CT may pass through the variable resistance element MTJ. In addition, to write '1' to the memory cell $M_{ij}$, the activated word line $WL_i$ may have the positive supply voltage VDD, and accordingly, a current flowing from the source line $SL_j$ toward the bit line $BL_j$ through the turned-on cell transistor CT may pass through the variable resistance element MTJ. During a read operation, the cell transistor CT may be turned-on, and a current flowing from the source line $SL_j$ toward the bit line $BL_j$ or a current flowing from the bit line $BL_j$ toward the source line $SL_j$,e.g., a read current, may pass through the cell transistor CT and the variable resistance element MTJ. In the present specification, the read current is assumed to flow from the source line $SL_j$ toward the bit line $BL_j$.

Referring to FIG. 3, a resistance of the variable resistance element MTJ may have a distribution. For example, as illustrated in FIG. 3, there may be distribution of the parallel resistance $R_P$ having an average $R_P'$ in memory cells storing '0', and there may be distribution of the anti-parallel resistance $R_{AP}$ having an average $R_{AP}'$ in memory cells storing '1'. In addition, there may be a reference resistance $R_{REF}$ between the distribution of the parallel resistance $R_P$ and the distribution of the anti-parallel resistance $R_{AP}$.

Figure 4:
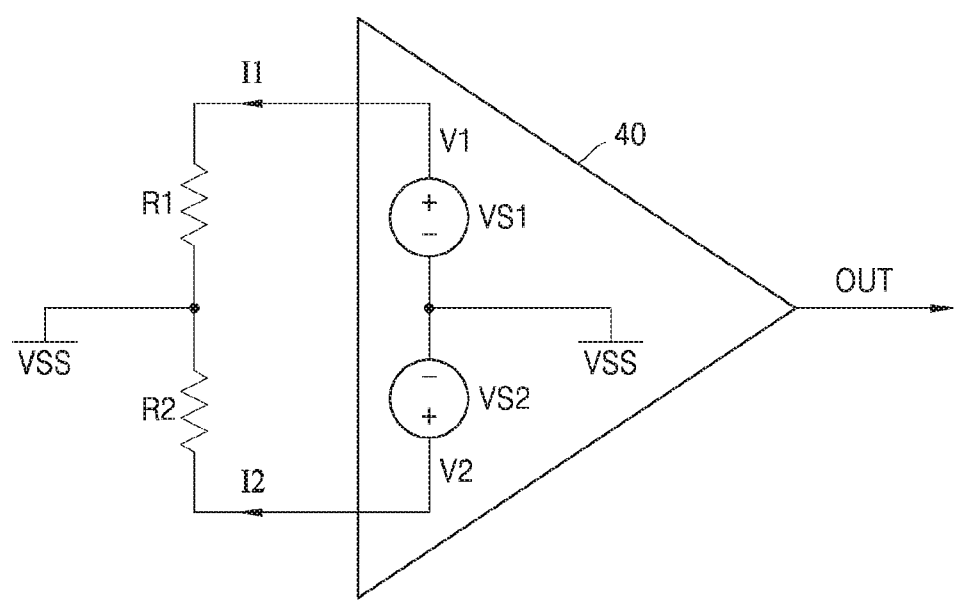
FIG. 4 is a circuit diagram illustrating a sense amplifier according to an exemplary embodiment of the inventive concept.

FIG. 4 is a circuit diagram illustrating a sense amplifier according to an exemplary embodiment of the inventive concept. As described above with reference to FIGS. 2 and 3, to detect a value stored in the memory cell $M_{ij}$, a resistance of the variable resistance element MTJ included in the memory cell $M_{ij}$, may be detected.

In exemplary embodiments of the inventive concept, the sense amplifier 40 may apply voltages to input ends and may generate an output signal OUT based on currents caused by the applied voltages. For example, as illustrated in FIG. 4, the sense amplifier 40 may include a first voltage source VS1 providing a first voltage V1 and a second voltage source VS2 providing a second voltage V2. In exemplary embodiments of the inventive concept, the first voltage V1 and the second voltage V2 may match each other, and for example, the first voltage source VS1 and the second voltage source VS2 may be source followers receiving substantially the same bias voltage. Likewise, the sense amplifier 40 applying a voltage and sensing a current caused by the voltage may be referred to as a current input sense amplifier.

A first resistor R1 and a second resistor R2 may be connected to the sense amplifier 40, and for example, the first resistor R1 may be a reference resistor for detecting a resistance of the second resistor R2. While a first current I1 may be generated by the first voltage V1 and the first resistor R1, a second current I2 may be generated by the second voltage V2 and the second resistor R2. The first current I1 and the second current I2 may be inversely proportional to resistances of the first resistor R1 and the second resistor R2, respectively, and when sizes of the first voltage V1 and the second voltage V2 match each other, the sense amplifier 40 may generate the output signal OUT corresponding to a comparison result from comparing sizes of the first current I1 and the second current I2. As a result, the output signal OUT may correspond to a result of comparing resistances of the first resistor R1 and the second resistor R2. Hereinafter, exemplary embodiments of the inventive concept will be described with reference to the current input sense amplifier, for example, as described above with reference to FIG. 4.

Figure 5B:
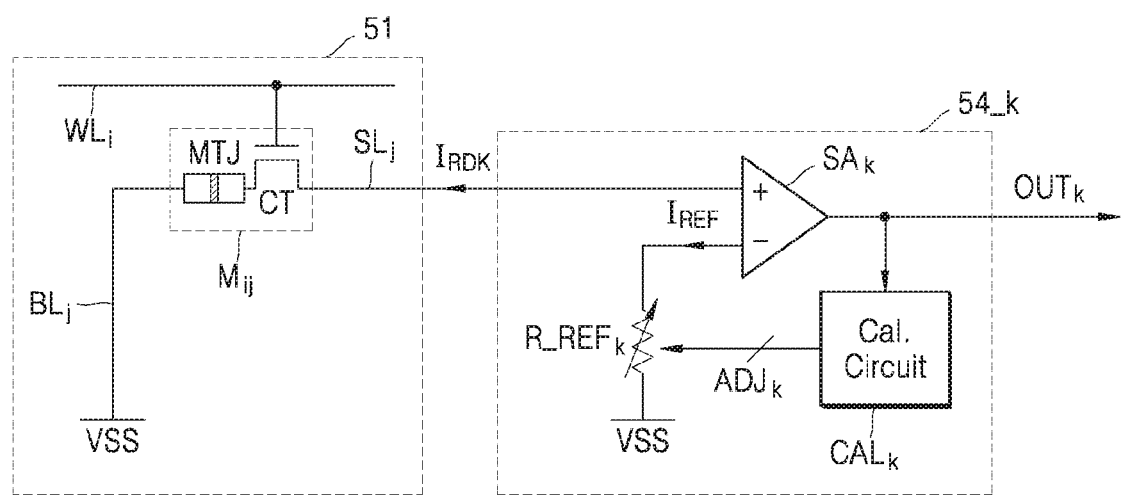

FIGS. 5A and 5B are circuit diagrams illustrating equivalent circuits of a read circuit and a surrounding circuit thereof, according to exemplary embodiments of the inventive concept. In detail, FIG. 5A shows an equivalent circuit of a calibration resistor circuit 55 and a $k^{th}$ read circuit 54_$k$ in a memory device 50a performing a calibrate operation, and FIG. 5B shows an equivalent circuit of a cell array 51 and the $k^{th}$ read circuit 54_$k$ in a memory device 50b performing a read operation. In the present specification, the $k^{th}$ read circuit 54_$k$ may correspond to any read circuit included in the read circuits 14 of FIG. 1 and may be simply referred to as a read circuit. Repeat descriptions are omitted below.

Referring to FIG. 5A, during a calibrate operation, the calibration resistor circuit 55 and the read circuit 54_$k$ may be electrically connected, and the calibration current $I_{CAL}$ may flow from the read circuit 54_$k$ to a negative supply voltage VSS through a calibration resistor R_CAL. In the present specification, the negative supply voltage VSS may refer to a voltage lower than the positive supply voltage VDD and may be referred to as a ground voltage. As described above with reference to FIG. 4, when a sense amplifier $SA_k$ of the read circuit 54_$k$ is a current input sense amplifier, a size of the calibration current $I_{CAL}$ may depend on a resistance of the calibration resistor R_CAL, e.g., a calibration resistance $R_{CAL}$.

The read circuit 54_$k$ may include the sense amplifier $SA_k$, a reference resistor R_$REF_k$, and a calibration circuit $CAL_k$. The reference resistor R_$REF_k$ may be connected to the sense amplifier $SA_k$, and the reference current $I_{REF}$ may flow from the sense amplifier $SA_k$ to the negative supply voltage VSS through the reference resistor R_$REF_k$. The reference resistor R_$REF_k$ may be a variable resistance element as illustrated in FIG. 5A and may have a resistance that changes according to an adjustment signal $ADJ_k$ received from the calibration circuit $CAL_k$.

During the calibrate operation, the calibration circuit $CAL_k$, for example, may be enabled by the controller 16 of FIG. 1 and may generate the adjustment signal $ADJ_k$ based on an output signal $OUT_k$ of the sense amplifier $SA_k$. As described above, the sense amplifier $SA_k$ may compare currents input thereto and output the output signal $OUT_k$. In exemplary embodiments of the inventive concept, the calibration circuit $CAL_k$ may adjust a resistance $R_{REFk}$ of the reference resistor R_$REF_k$ through the adjustment signal $ADJ_k$. For example, the calibration circuit $CAL_k$ may gradually increase the resistance $R_{REFk}$ from a lowest value or gradually decrease the resistance $R_{REFk}$ from a highest value. When the output signal $OUT_k$ transitions, the calibration circuit $CAL_k$ may maintain the adjustment signal $ADJ_k$ so that the reference resistor R_$REF_k$ may have a current resistance $R_{REFk}$. In exemplary embodiments of the inventive concept, the calibration circuit $CAL_k$ may adjust the resistance $R_{REFk}$ of the reference resistor R_$REF_k$ using a method such as a binary search algorithm based on the output signal $OUT_k$.

Referring to FIG. 5B, during a read operation, the memory cell $M_{ij}$ selected by an activated word line $WL_i$ and the read circuit 54_k may be electrically connected, and the read current $I_{RDk}$ may flow from the read circuit 54_k to the negative supply voltage VSS sequentially through the source line $SL_j$, the memory cell $M_{ij}$, and the bit line $BL_j$. The column decoder 13 of FIG. 1 may electrically connect the memory cell $M_{ij}$ and the read circuit 54_k between the cell array 51 and the read circuit 54_k. As described above with reference to FIG. 4, the read current $I_{RDk}$ may depend on a resistance of the variable resistance element MTJ included in the memory cell $M_{ij}$.

During the read operation, the calibration circuit $CAL_k$ of the read circuit 54_k may output the adjustment signal $ADJ_k$ having a value determined in FIG. 5A, and accordingly, the reference resistor $R\_REF_k$ may have a resistance (e.g., $R_{REFk}$) determined during the calibrate operation of FIG. 5A.

Thus, the controller 16 of FIG. 1 may control a switch set, which will be described below, to allow the sense amplifier $SA_k$ to compare the reference current $I_{REF}$ passing through the reference resistor $R\_REF_k$ with the read current $I_{RDk}$ passing through the memory cell $M_{ij}$ during the read operation (e.g., as shown in FIG. 5B) and compare the reference current $I_{REF}$ with the calibration current $I_{CAL}$ passing through the calibration resistor R_CAL during the calibrate operation (e.g., as shown in FIG. 5A). In other words, a path of the reference current $I_{REF}$ during the read operation is different from a path of the first reference current $I_{REF}$ during the calibrate operation.

Figure 6A:
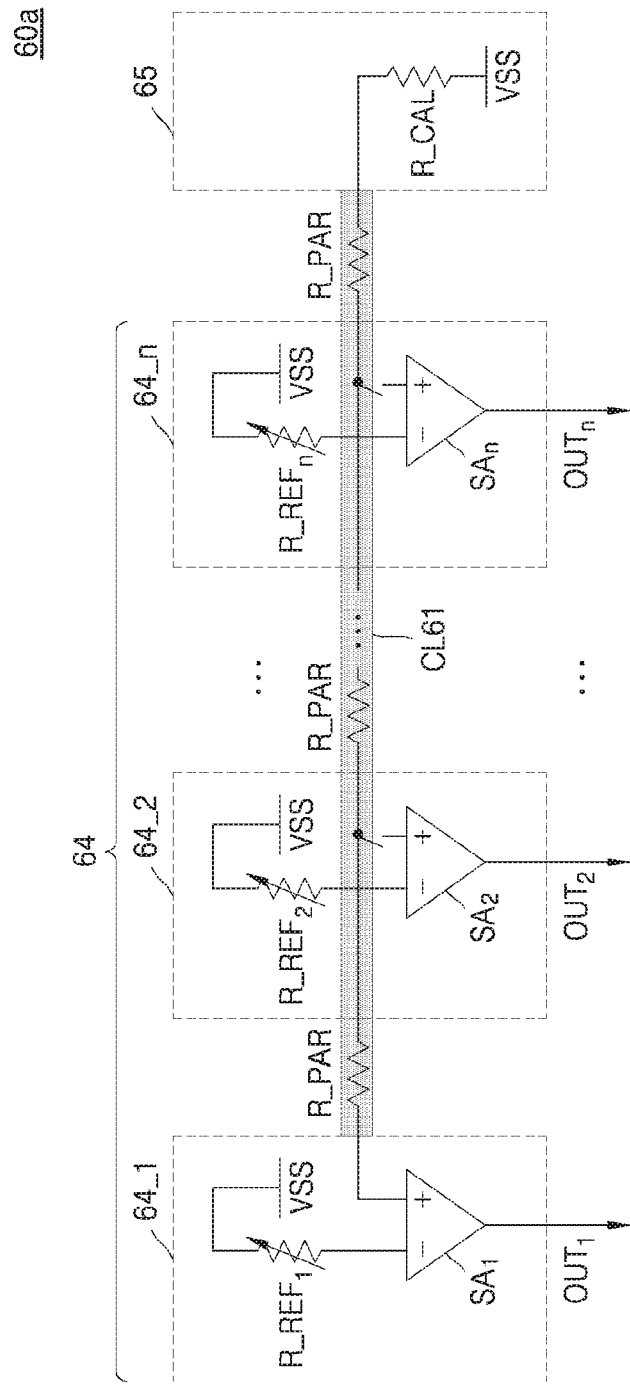
FIGS. 6A and 6B are circuit diagrams illustrating a memory device performing a calibrate operation using one conductive line, according to comparative examples.
Figure 6B:
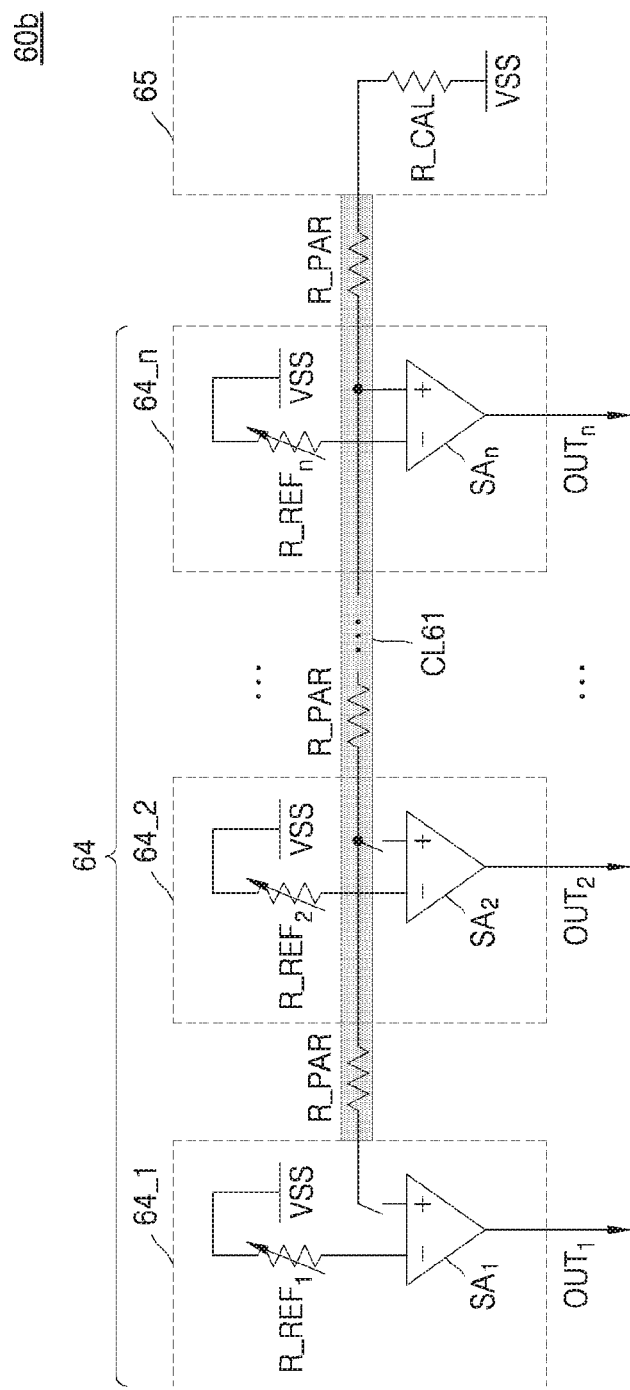

FIGS. 6A and 6B are circuit diagrams illustrating a memory device performing a calibrate operation using one conductive line, according to comparative examples. In detail, FIG. 6A shows a memory device 60a performing a calibrate operation of a first read circuit 64_1, and FIG. 6B shows a memory device 60b performing a calibrate operation of an $n^{th}$ read circuit 64_n. Repeat descriptions are omitted below.

Referring to FIG. 6A, read circuits 64 may include first to $n^{th}$ read circuits 64_1 to 64_n (where n is an integer greater than 2), and a first conductive line CL61 may extend across the read circuits 64. During the calibrate operation, one of the first to $n^{th}$ read circuits 64_1 to 64_n may be connected to the calibration resistor R_CAL of a calibration resistor circuit 65 through the first conductive line CL61. For example, as illustrated in FIG. 6A, for calibration of the first read circuit 64_1 (or a first reference resistor $R\_REF_1$), a first sense amplifier $SA_1$ of the first read circuit 64_1 may have an input end electrically connected to the first conductive line CL61, whereas second to $n^{th}$ sense amplifiers $SA_2$ to $SA_n$ respectively included in the second to $n^{th}$ read circuits 64_2 to 64_n may be electrically disconnected from the first conductive line CL61.

The first conductive line CL61 may have a resistance proportional to its length. For example, as illustrated in FIG. 6A, the first conductive line CL61 may be modeled to have parasitic resistors R_PAR between mutually adjacent read circuits (e.g., 64_1 and 64_2) and between the $n^{th}$ read circuit 64_n and the calibration resistor circuit 65. Accordingly, the first sense amplifier $SA_1$ may output a first output signal $OUT_1$ by comparing a resistance $R_{REF1}$ of the first reference resistor $R\_REF_1$ with a resistance "$n*R_{PAR}+R_{CAL}$" corresponding to a sum of n times of a resistance $R_{PAR}$ of the parasitic resistor R_PAR and a resistance of the calibration resistor R_CAL, e.g., the calibration resistance $R_{CAL}$.

Accordingly, the resistance $R_{REF1}$ of the first reference resistor $R\_REF_1$ may be calibrated to have the resistance "$n*R_{PAR}+R_{CAL}$".

Referring to FIG. 6B, for calibration of the $n^{th}$ read circuit 64_n (or an $n^{th}$ reference resistor $R\_REF_n$), the $n^{th}$ sense amplifier $SA_n$ of the $n^{th}$ read circuit 64_n may have an input end electrically connected to the first conductive line CL61, whereas sense amplifiers (e.g., $SA_1$, $SA_2$, etc.) included in the other read circuits (e.g., 64_1, 64_2, etc.) may be electrically disconnected from the first conductive line CL61. As described above with reference to FIG. 6A, the first conductive line CL61 may have a resistance proportional to its length, and thus, the $n^{th}$ sense amplifier $SA_n$ may output an $n^{th}$ output signal $OUT_n$ by comparing a resistance $R_{REFn}$ of the $n^{th}$ reference resistor $R\_REF_n$ with a resistance corresponding to a sum of the resistance $P_{PAR}$ of the parasitic resistor P_PAR and the resistance $R_{CAL}$ of the calibration resistor R_CAL. Accordingly, the resistance $R_{REFn}$ of the $n^{th}$ reference resistor $R\_REF_n$ may be calibrated to have a resistance "$R_{PAR}-R_{CAL}$", and this may be different from the calibrated resistance "$n*R_{PAR}+R_{CAL}$" of the first reference resistor $R\_REF_1$, as described above with reference to FIG. 6A. As a result, the first to $n^{th}$ reference resistors $R\_REF_1$ to $R\_REF_n$ respectively included in the first to $n^{th}$ read circuits 64_1 to 64_n may be calibrated to have different resistances, and an error may occur during a read operation.

Figure 7A:
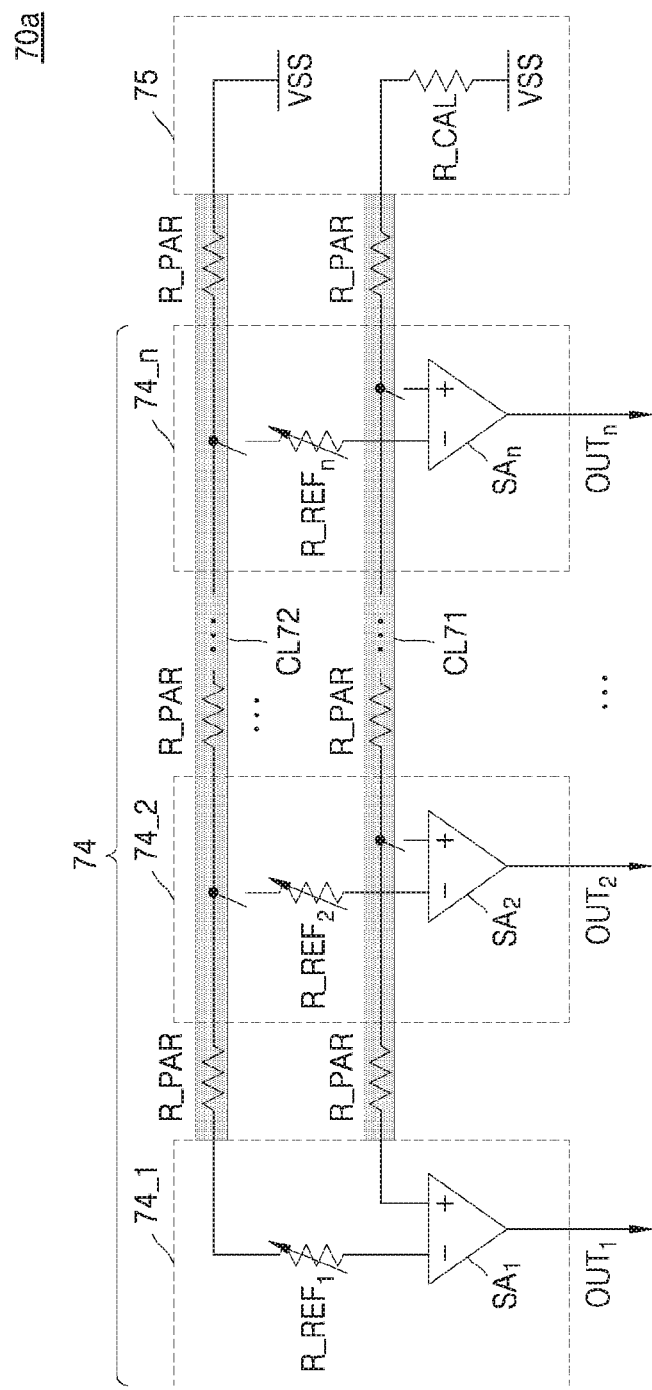
FIGS. 7A and 7B are circuit diagrams illustrating a memory device performing a calibrate operation using two conductive lines, according to exemplary embodiments of the inventive concept.
Figure 7B:
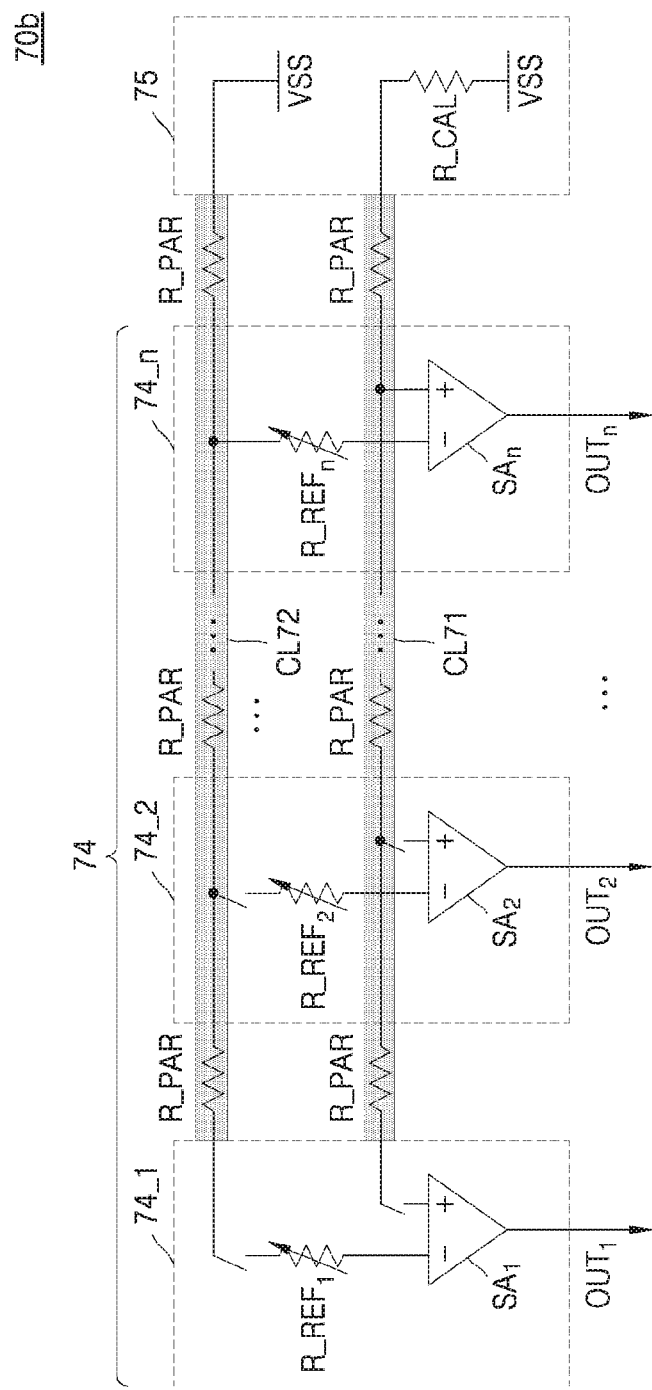

FIGS. 7A and 7B are circuit diagrams illustrating a memory device performing a calibrate operation using two conductive lines, according to exemplary embodiments of the inventive concept. In detail, FIG. 7A shows a memory device 70a performing a calibrate operation of a first read circuit 74_1, and FIG. 7B shows a memory device 70b performing a calibrate operation of an $n^{th}$ read circuit 74_n. Repeat descriptions are omitted below.

Referring to FIG. 7A, read circuits 74 may include first to $n^{th}$ read circuits 74_1 to 74_n (where n is a positive integer), and a first conductive line CL71 and a second conductive line CL72 may extend across the read circuits 74. The negative supply voltage VSS may be applied to each of the first conductive line CL71 and the second conductive line CL72.

During a calibrate operation, one of the first to $n^{th}$ read circuits 74_1 to 74_n may be connected to a calibration resistor circuit 75 through the first conductive line CL71 and the second conductive line CL72. For example, as illustrated in FIG. 7A, for calibration of the first read circuit 74_1 (or the first reference resistor $R\_REF_1$), the first sense amplifier $SA_1$ of the first read circuit 74_1 may have an input end electrically connected to the first conductive line CL71, whereas the second to $n^{th}$ sense amplifiers $SA_2$ to $SA_n$ respectively included in the second to $n^{th}$ read circuits 74_2 to 74_n may be electrically disconnected from the first conductive line CL71. In addition, unlike the first reference resistor $R\_REF_1$ of FIG. 6A having an end where the negative supply voltage VSS is applied in the first read circuit 64_1, the first reference resistor $R\_REF_1$ of the first read circuit 74_1 may have an end electrically connected to the second conductive line CL72, and the second to $n^{th}$ reference resistors $R\_REF_2$ to $R\_REF_n$ respectively included in the second to $n^{th}$ read circuits 74_2 to 74_n may be electrically disconnected from the second conductive line CL72.

In other words, the first conductive line CL71 may include at least one portion configured to allow the calibration current (e.g., $I_{CAL}$), to pass therethrough and flow to the calibration resistor R_CAL. The second conductive line CL72 may include at least one portion configured to allow the reference current (e.g., $I_{REF}$) to pass therethrough from the first reference resistor (e.g., R_REF$_1$) during the calibrate operation, The first conductive line CL71 and the second conductive line CL72 may each have a resistance proportional to length. In exemplary embodiments of the inventive concept, the first conductive line CL71 and the second conductive line CL72 may have substantially the same structure, for example, substantially the same length, and thus, as illustrated in FIG. 7A, may be modeled to respectively have parasitic resistors R_PAR having substantially the same resistance between mutually adjacent read circuits (e.g., 74_1 and 74_2). Accordingly, the first sense amplifier SA$_1$ may output the first output signal OUT$_1$ by comparing a resistance "R$_{REF1}$+n*R$_{PAR}$" corresponding to a sum of the resistance R$_{REF1}$ of the first reference resistor R_REF$_1$ and n times of the resistance R$_{PAR}$ of the parasitic resistor R_PAR with the resistance "n*R$_{PAR}$+R$_{CAL}$" corresponding to a sum of n times of the resistance R$_{PAR}$ of the parasitic resistor R_PAR and the resistance (or the calibration resistance) R$_{CAL}$ of the calibration resistor R_CAL. Accordingly, the resistance R$_{REF1}$ of the first reference resistor R_REF$_1$ may be calibrated to have the resistance R$_{CAL}$ of the calibration resistor R_CAL.

Referring to FIG. 7B, for calibration of the n$^{th}$ read circuit 74_n (or the n$^{th}$ reference resistor R_REF$_n$), the n$^{th}$ sense amplifier SA$_n$ of the n$^{th}$ read circuit 74_n may have an input end electrically connected to the first conductive line CL71, whereas sense amplifiers (e.g., SA$_1$, SA$_2$, etc.) included in the other read circuits (e.g., 74_1, 74_2, etc.) may be electrically disconnected from the first conductive line CL71. In addition, unlike the n$^{th}$ reference resistor R_REF$_n$ of FIG. 6B having an end where the negative supply voltage VSS is applied in the n$^{th}$ read circuit 64_n, the n$^{th}$ reference resistor R_REF$_n$ of the n$^{th}$ read circuit 74_n may have an end electrically connected to the second conductive line CL72, and reference resistors (e.g., R_REF$_1$, R_REF$_2$) included in the other read circuits (e.g., 74_1, 74_2) may be electrically disconnected from the second conductive line CL72. As described above with reference to FIG. 7A, the first conductive line CL71 and the second conductive line CL72 may each have a resistance proportional to length, and accordingly, the n$^{th}$ sense amplifier SA$_n$ may output the n$^{th}$ output signal OUTn by comparing a resistance "R$_{REFn}$+R$_{PAR}$" corresponding to a sum of the resistance R$_{REFn}$ of the n$^{th}$ reference resistor R_REF$_n$ and the resistance R$_{PAR}$ of the parasitic resistor R_PAR with the resistance "R$_{PAR}$+R$_{CAL}$" corresponding to a sum of the resistance R$_{PAR}$ of the parasitic resistor R_PAR and the resistance (or the calibration resistance) R$_{CAL}$ of the calibration resistor R_CAL. Accordingly, the resistance R$_{REFn}$ of the n$^{th}$ reference resistor R_REF$_n$ may be calibrated to have the resistance R$_{CAL}$ of the calibration resistor R_CAL, and this may match the calibrated resistance R$_{CAL}$ of the first reference resistor R_REF$_1$, which is described above with reference to FIG. 7A. As a result, the first to n$^{th}$ reference resistors R_REF$_1$ to R_REF$_n$ respectively included in the first to n$^{th}$ read circuits 74_1 to 74_n may be calibrated to each have substantially the same resistance, and unlike the examples described above with reference to FIGS. 6A and 6B, occurrence of an error may be prevented during a read operation.

Figure 8:
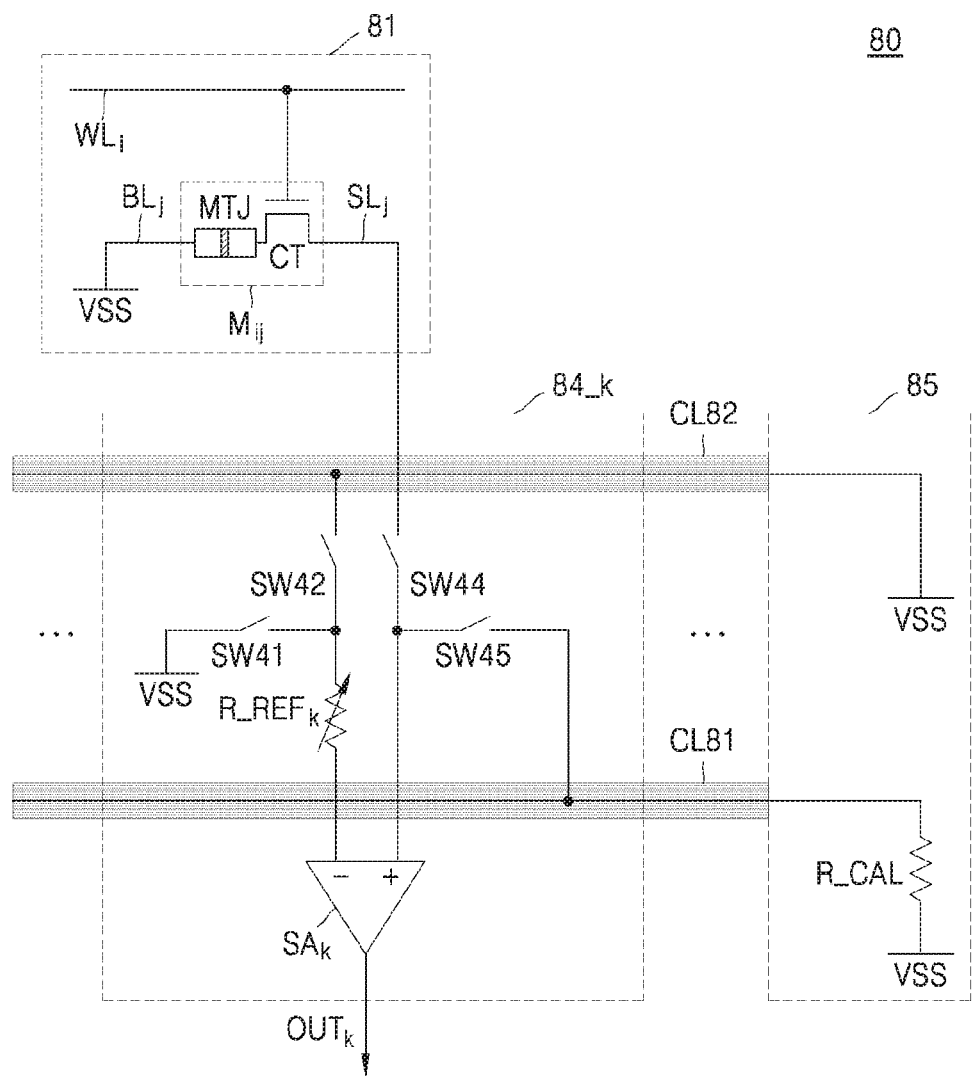
FIG. 8 is a circuit diagram illustrating a portion of a memory device according to an exemplary embodiment of the inventive concept.

FIG. 8 is a circuit diagram illustrating a portion of a memory device according to an exemplary embodiment of the inventive concept. In detail, FIG. 8 shows an equivalent circuit of a memory device 80 including a cell array 81, a read circuit 84_k, and a calibration resistor circuit 85. A column decoder may electrically connect the memory cell M$_{ij}$ and the read circuit 84_k between the cell array 81 and the read circuit 84_k according to an address.

Referring to FIG. 8, the memory device 80 may include a first conductive line CL81 and a second conductive line CL82 extending across read circuits including the read circuit 84_k. Accordingly, as described above with reference to FIGS. 7A and 7B, the reference resistor R_REF$_k$ of the read circuit 84_k may be calibrated to have the resistance R$_{CAL}$ of the calibration resistor R_CAL. Hereinafter, FIG. 8 will be described with reference to FIG. 1.

The cell array 81 may include the memory cell M$_{ij}$ connected to the word line WL$_i$, and the memory cell M$_{ij}$ may be connected to the read circuit 84_k through the source line SL$_j$ during a read operation and may be connected to the negative supply voltage VSS through the bit line BL$_j$. The calibration resistor circuit 85 may include the calibration resistor R_CAL and may be connected to the first conductive line CL81 and the second conductive line CL82.

The read circuit 84_k may include the sense amplifier SA$_k$, the reference resistor R_REF$_k$, and a switch set. The read circuit 84_k may further include a calibration circuit (e.g., CAL$_k$ of FIG. 5A) for adjusting a resistance of the reference resistor R_REF$_k$ based on the output signal OUT$_k$ of the sense amplifier SA$_k$. The switch set may include a plurality of switches SW41, SW42, SW44, and SW45, and may be turned on or off by the controller 16 of FIG. 1 controlling a calibrate operation. Each of the plurality of switches SW41, SW42, SW44, and SW45 may have any structure capable of electrically connecting or disconnecting both ends according to control of the controller 16. For example, each of the plurality of switches SW41, SW42, SW44, and SW45 may include an n-channel field effect transistor (NFET) and/or a p-channel field effect transistor (PFET), and the controller 16 may adjust a gate voltage of the NFET.

The controller 16 may control the plurality of switches SW41, SW42, SW44, and SW45 to form the equivalent circuit of FIG. 5B during a read operation. For example, as described above with reference to FIG. 5B, the controller 16 may turn a first switch SW41 and a fourth switch SW44 on and a second switch SW42 and a fifth switch SW45 off to allow the sense amplifier SA$_k$ to compare the reference current I$_{REF}$ passing through the reference resistor R_REF$_k$ with the read current I$_{RDk}$ passing through the memory cell M$_{ij}$. Here, the first switch SW41 may provide the negative supply voltage VSS to the reference resistor R_REF$_k$ while turned on. The negative supply voltage VSS may be a ground potential. The first conductive line CL81 and the second conductive line CL82 are electrically disconnected from read circuits during the read operation.

On the other hand, the controller 16 may control the plurality of switches SW41, SW42, SW44, and SW45 to form the equivalent circuit of FIG. 5A during a calibrate operation. For example, the controller 16 may turn the first switch SW41 and the fourth switch SW44 off and the second switch SW42 and the fifth switch SW45 on to allow the sense amplifier SA$_k$ to compare the reference current I$_{REF}$ passing through the reference resistor R_REF$_k$ with the calibration current I$_{CAL}$ passing through the calibration resistor R_CAL. Here, the second switch SW42 may electrically connect the reference resistor R_REF$_k$ and the second conductive line CL82. The fifth switch SW45 may electrically connect a first input end of the sense amplifier SA$_k$ to the calibration resistor R_CAL via the first conductive line CL81.

For example, the second switch SW42 and the fifth switch SW45 may have substantially the same structure and thus provide substantially the same on-resistance, As such, the calibration current $I_{CAL}$ and the reference current $I_{REF}$ each pass through the same number of switches, and an error due to on-resistance of switches may be removed.

Figure 9:
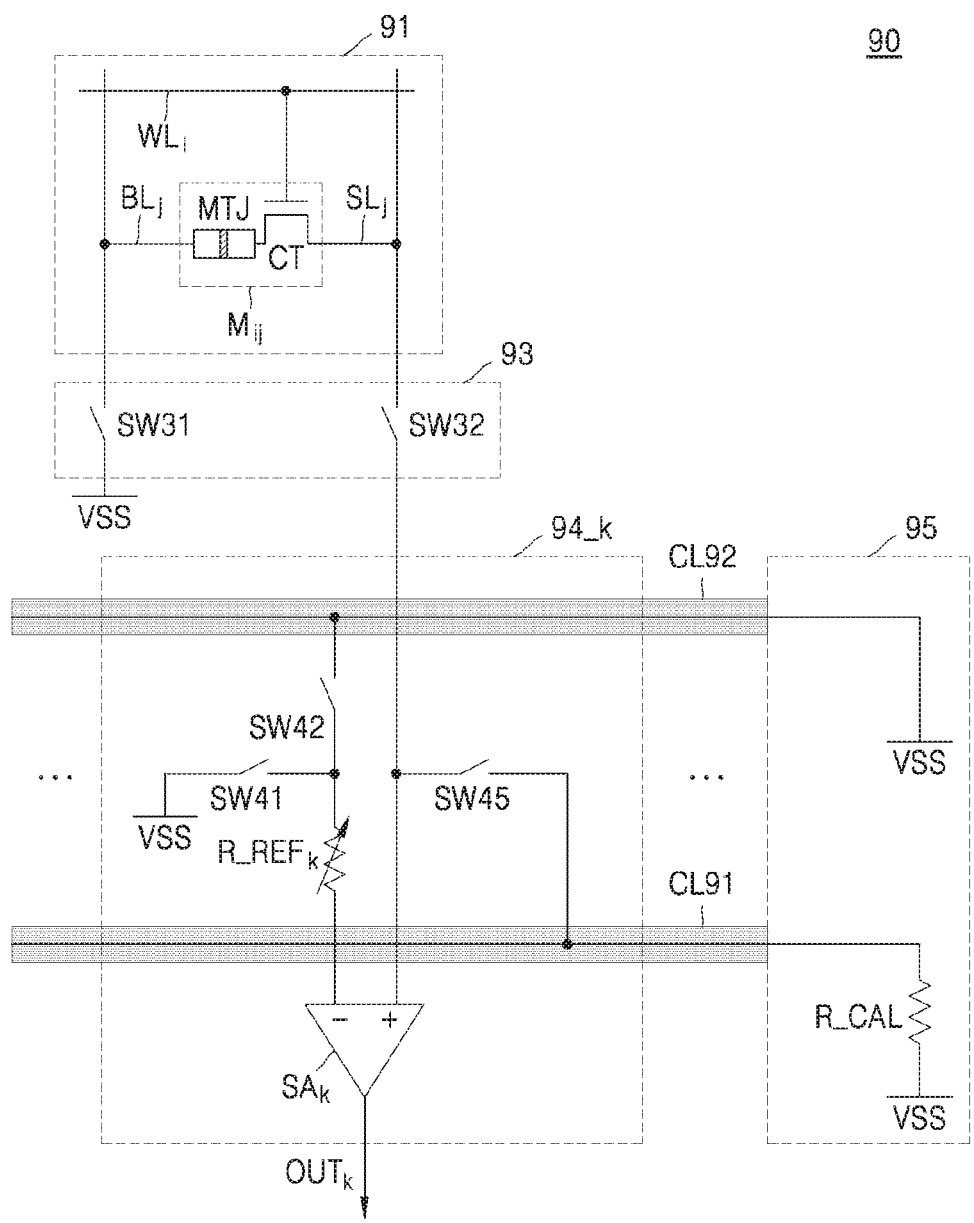
FIG. 9 is a circuit diagram illustrating a portion of a memory device according to an exemplary embodiment of the inventive concept.

FIG. 9 is a circuit diagram illustrating a portion of a memory device according to an exemplary embodiment of the inventive concept. In detail, FIG. 9 shows an equivalent circuit of a memory device 90 including a cell array 91, a column decoder 93, a read circuit 94_k, and a calibration resistor circuit 95. Compared to the example of FIG. 8, a switch corresponding to at least one of the plurality of switches SW41, SW42, SW44, and SW45 included in the read circuit 84_k of FIG. 8 may be included in the column decoder 93 of FIG. 9. Hereinafter, descriptions of elements in FIG. 9 already provided with reference to FIG. 8 will be omitted, and FIG. 9 will be described with reference to FIG. 1.

Referring to FIG. 9, the memory device 90 may include a first conductive line CL91 and a second conductive line CL92 extending across read circuits including the read circuit 94_k. The cell array 91 may include the memory cell $A4_{13}$ connected to the word line $WL_i$, the source line $SL_j$, and the bit line BLj. The calibration resistor circuit 95 may include the calibration resistor R_CAL and may be connected to the first conductive line CL91 and the second conductive line CL92. The read circuit 94_k may include the sense amplifier $SA_k$, the reference resistor $R\_REF_k$, and a switch set, and the switch set may include a plurality of switches SW41, SW42, and SW45. Compared to the read circuit 84_k of FIG. 8, a switch corresponding to the fourth switch SW44 of FIG. 8 may be omitted from the switch set of the read circuit 94_k of FIG. 9.

The column decoder 93 may include a first column switch SW31 and a second column switch SW32 which are controlled based on an address (or a column address). As illustrated in FIG. 9, the first column switch SW31 may apply or block the negative supply voltage VSS to the bit line BL, and the second column switch SW32 may connect or disconnect the source line $SL_j$ to or from the read circuit 94_k. In exemplary embodiments of the inventive concept, during a calibrate operation of the read circuit 94_k, the column decoder 93 may electrically disconnect the cell array 91 and the read circuit 94_k by turning off the second column switch SW32. In other words, a function of the fourth switch SW44 of FIG. 8 may be performed by the second column switch SW32 included in the column decoder 93. To this end, the controller 16 of FIG. 1 may control not only the switch set included in the read circuit 94_k but also the column decoder 93.

Figure 10:
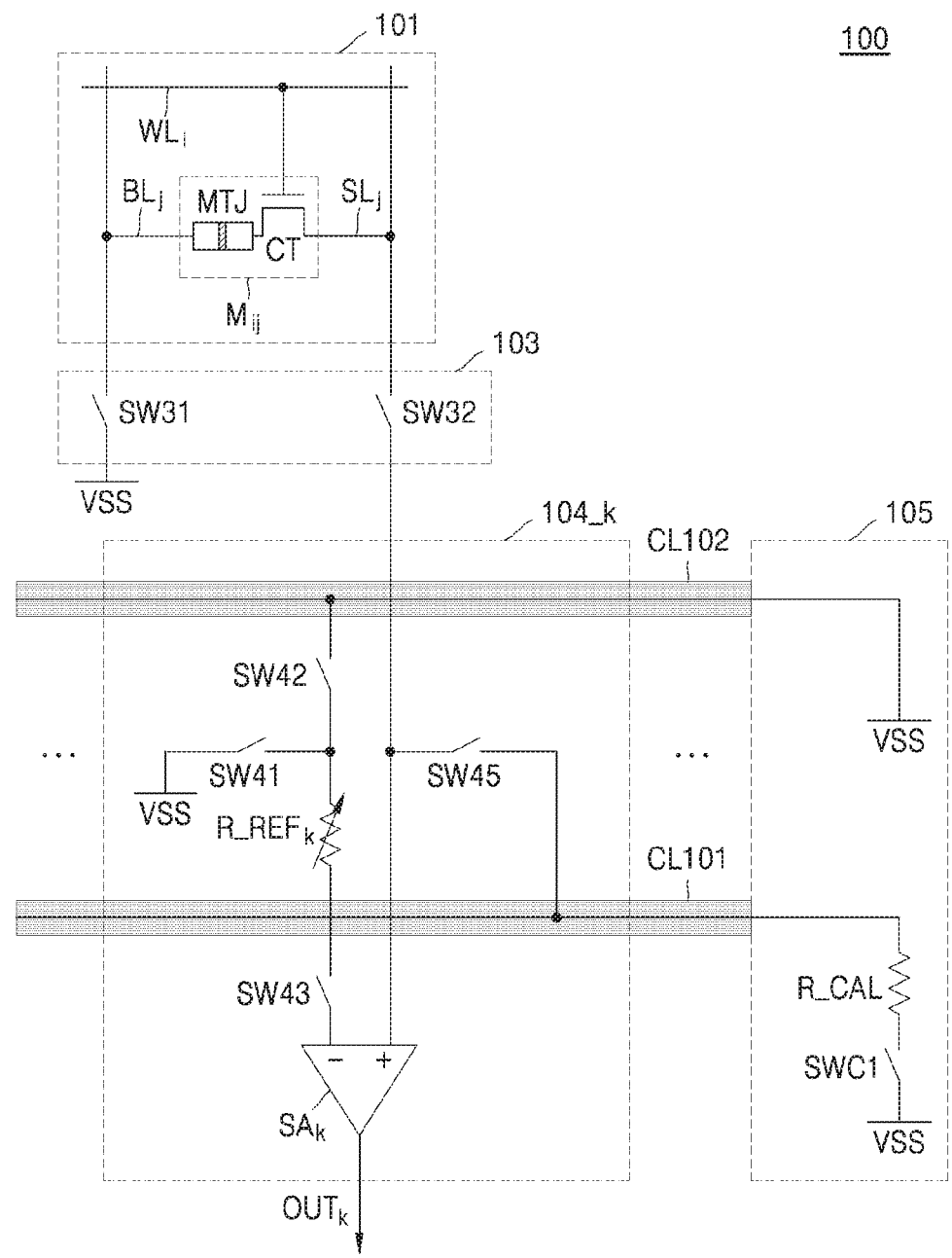
FIG. 10 is a circuit diagram illustrating a portion of a memory device according to an exemplary embodiment of the inventive concept.

FIG. 10 is a circuit diagram illustrating a portion of a memory device according to an exemplary embodiment of the inventive concept. In detail, FIG. 10 shows an equivalent circuit of a memory device 100 including a cell array 101, a column decoder 103, a read circuit 104_k, and a calibration resistor circuit 105. Compared to the example of FIG. 9, the read circuit 104_k of FIG. 10 may further include a third switch SW43 between the reference resistor $R\_REF_k$ and the sense amplifier $SA_k$, and the calibration resistor circuit 105 of FIG. 10 may include a first compensation switch SWC1. Hereinafter, a description of elements in FIG. 10 already given above with reference to FIG. 9 will be omitted, and FIG. 10 will be described with reference to FIG. 1.

Referring to FIG. 10, the memory device 100 may include a first conductive line CL101 and a second conductive line CL102 extending across read circuits including the read circuit 104_k. The cell array 101 may include the memory cell $M_{ij}$ connected to the word line $WL_i$, the source line $SL_j$, and the bit line $BL_j$. The calibration resistor circuit 105 may include the calibration resistor R_CAL and the first compensation switch SWC1 and may be connected to the first conductive line CL101 and the second conductive line CL102. The read circuit 104_k may include the sense amplifier $SA_k$, the reference resistor $R\_REF_k$, and a switch set, and the switch set may include the plurality of switches SW41, SW42, SW43, and SW45. The column decoder 103 may include the first column switch SW31 and the second column switch SW32. The plurality of switches SW41, SW42, SW43, and SW45 included in the read circuit 104_k and the first compensation switch SWC1 included in the calibration resistor circuit 105 may be controlled by the controller 16 of FIG. 1.

In exemplary embodiments of the inventive concept, the read circuit 104_k may include at least one switch to allow the read current $I_{RDk}$ and the reference current $I_{REF}$ to each pass through the same number of switches during a read operation. For example, during the read operation, the first switch SW41, the third switch SW43, the first column switch SW31, and the second column switch SW32 may be turned on, and the second switch SW42 and the fifth switch SW45 may be turned off. Accordingly, while the read current $I_{RDk}$ passing through the memory cell $M_{ij}$ may pass through the second column switch SW32 and the first column switch SW31, the reference current $I_{REF}$ passing through the reference resistor $R\_REF_k$ may pass through the third switch SW43 and the first switch SW41. When the switches illustrated in FIG. 10 have substantially the same structure, each of the switches may provide substantially the same on-resistance, and as the read current $I_{RDk}$ and the reference current $I_{REF}$ each pass through the same number of switches, an error due to on-resistance of switches may be removed. To this end, the read circuit 104_k may include the third switch SW43, and in exemplary embodiments of the inventive concept, while the third switch SW43 may have substantially the same structure (or on-resistance) as that of the second column switch SW32, the first switch SW41 may have substantially the same structure (or on-resistance) as that of the first column switch SW31.

In exemplary embodiments of the inventive concept, the read circuit 104_k and the calibration resistor circuit 105 may include at least one switch to allow the calibration current $I_{CAL}$ and the reference current $I_{REF}$ to each pass through the same number of switches during a calibrate operation. For example, during the calibrate operation, the second switch SW42, the third switch SW43, the fifth switch SW45, and the first compensation switch SWC1 may be turned on, and the first switch SW41 and the second column switch SW32 may be turned off. In other words, the third switch SW43 may electrically connect the second input end of the sense amplifier $SA_k$ with the reference resistor $R\_REF_k$. The first compensation switch SWC1 may electrically connect the calibration resistor R_CAL with the negative supply voltage VSS. Accordingly, while the calibration current $I_{CAL}$ passing through the calibration resistor R_CAL may pass through the fifth switch SW45 and the first compensation switch SWC1, the reference current $I_{REF}$ passing through the reference resistor $R\_REF_k$ may pass through the third switch SW43 and the second switch SW42.

When the switches illustrated in FIG. 10 have substantially the same structure, each of the switches may provide substantially the same on-resistance, and as the calibration current $I_{CAL}$ and the reference current $I_{REF}$ each pass through the same number of switches, an error due to on-resistance of switches may be removed. To this end, the read circuit 104_k may include the third switch SW43, and the calibration resistor circuit 105 may include the first compensation switch SWC1. In exemplary embodiments of the inventive concept, while the third switch SW43 may have substantially the same structure (or on-resistance) as that of the fifth switch SW45, the second switch SW42 may have substantially the same structure (or on-resistance) as that of the first compensation switch SWC1. In exemplary embodiments of the inventive concept, the third switch SW43 may be in an on-state all the time during the read operation and the calibrate operation.

Figure 11:
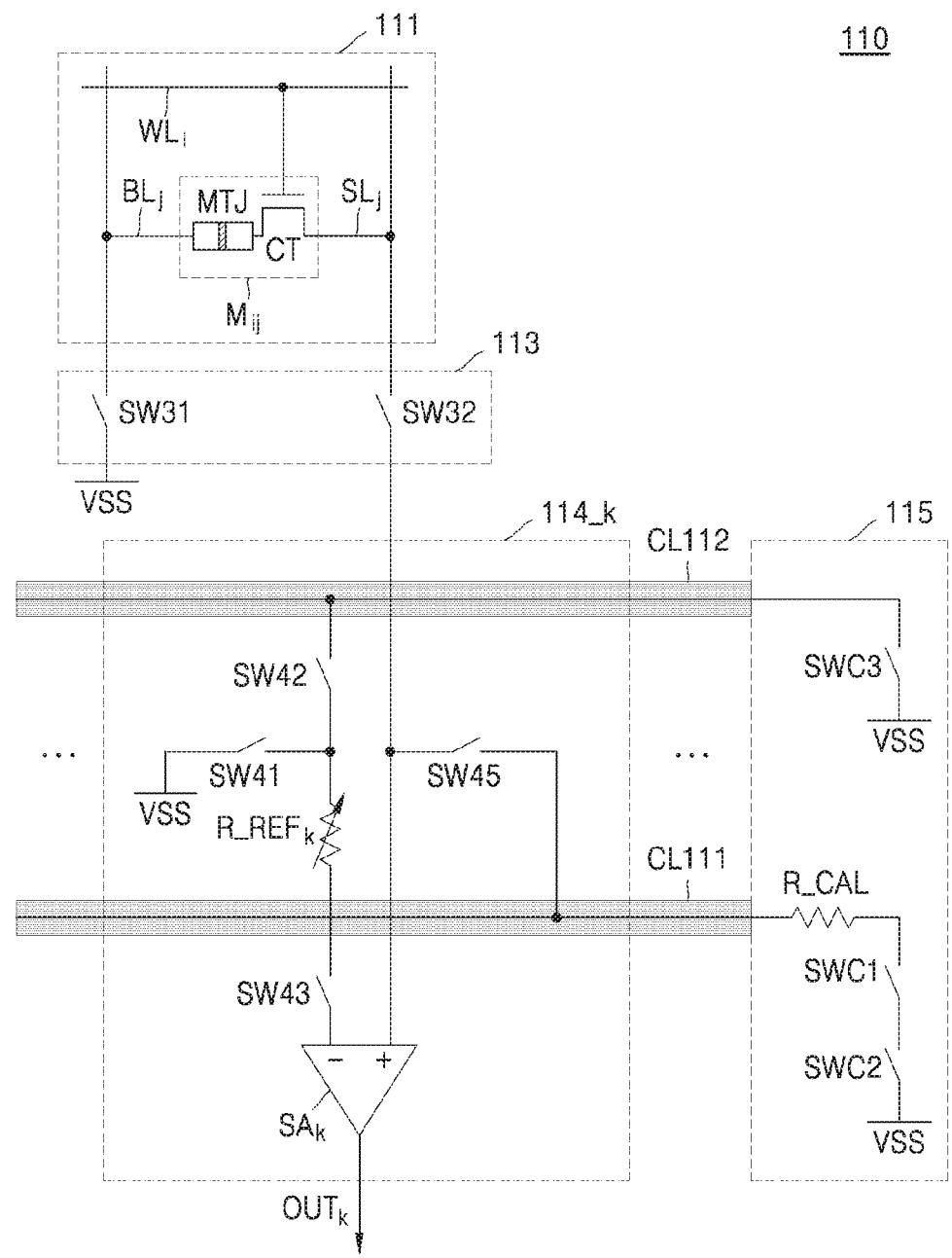
FIG. 11 is a circuit diagram illustrating a portion of a memory device according to an exemplary embodiment of the inventive concept.

FIG. 11 is a circuit diagram illustrating a portion of a memory device according to an exemplary embodiment of the inventive concept. In detail, FIG. 11 shows an equivalent circuit of a memory device 110 including a cell array 111, a column decoder 113, a read circuit 114_k, and a calibration resistor circuit 115. Compared to the example of FIG. 10, the calibration resistor circuit 115 of FIG. 11 may further include a second compensation switch SWC2 and a third compensation switch SWC3. Hereinafter, description of elements in FIG. 11 already given above with reference to FIG. 10 will be omitted, and FIG. 11 will be described with reference to FIG. 1.

Referring to FIG. 11, the memory device 110 may include a first conductive line CL111 and a second conductive line CL112 extending across read circuits including the read circuit 114_k. The cell array 111 may include the memory cell $M_{ij}$ connected to the word line $WL_i$, the source line $SL_j$, and the bit line $BL_j$. The calibration resistor circuit 115 may include the calibration resistor R_CAL, the first compensation switch SWC1, the second compensation switch SWC2, and the third compensation switch SWC3, and may be connected to the first conductive line CL111 and the second conductive line CL112. The read circuit 114_k may include the sense amplifier $SA_k$, the reference resistor $R\_REF_k$, and a switch set, and the switch set may include the plurality of switches SW41, SW42, SW43, and SW45. The column decoder 113 may include the first column switch SW31 and the second column switch SW32. The plurality of switches SW41, SW42, SW43, and SW45 included in the read circuit 114_k and the first to third compensation switches SWC1 to SWC3 included in the calibration resistor circuit 115 may be controlled by the controller 16 of FIG. 1.

In exemplary embodiments of the inventive concept, the calibration resistor circuit 115 may include the third compensation switch SWC3 between the negative supply voltage VSS (e.g., ground potential) and the second conductive line CL112 where the reference current $I_{REF}$ flows during a calibrate operation, and may include the second compensation switch SWC2 providing on-resistance that is substantially the same as that of the third compensation switch SWC3 and connected to the first compensation switch SWC1 in series where the calibration current $I_{CAL}$ flows. The second compensation switch SWC2 may be disposed between the first conductive line CL111 and the negative supply voltage VSS (e.g., between the first compensation switch SWC1 and the negative supply voltage VSS). Accordingly, as described above with reference to FIG. 10, during the calibrate operation, while the calibration current $I_{CAL}$ may pass through the fifth switch SW45, the first compensation switch SWC1, and the second compensation switch SWC2, the reference current $I_{REF}$ may pass through the third switch SW43, the second switch SW42, and the third compensation switch SWC3.

Figure 12A:
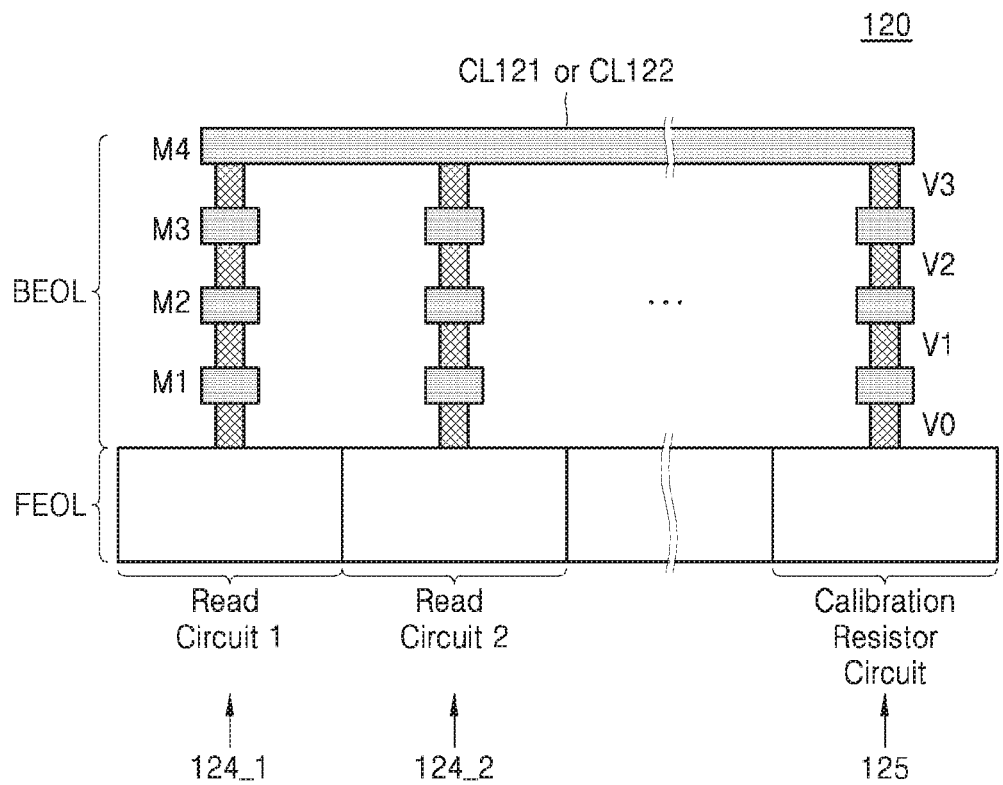
FIG. 12A is a side view schematically illustrating a portion of a memory device, according to an exemplary embodiment of the inventive concept.
Figure 12B:
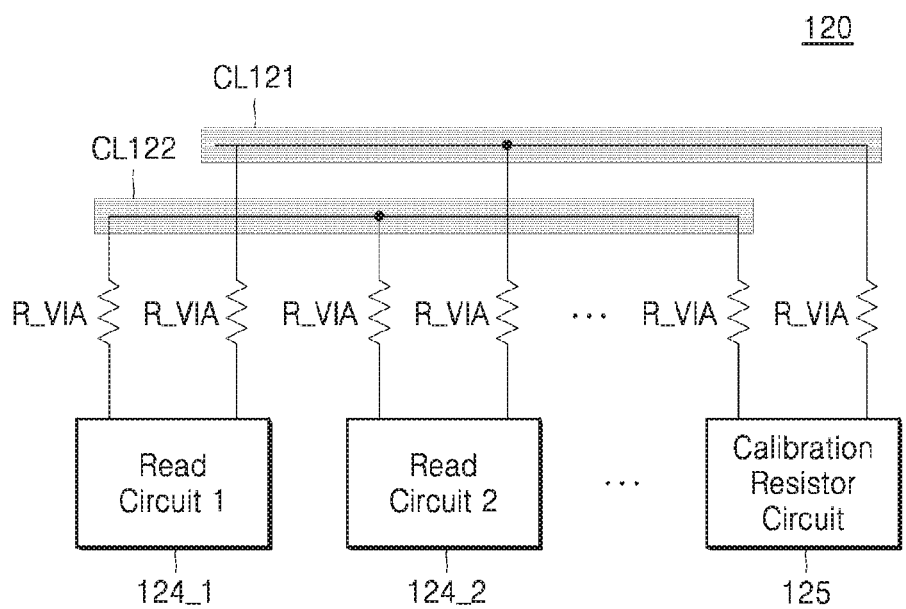
FIG. 12B is a circuit diagram schematically illustrating a portion of the memory device of FIG. 12A, according to an exemplary embodiment of the inventive concept.

FIG. 12A is a side view schematically illustrating a portion of a memory device, according to an exemplary embodiment of the inventive concept, and FIG. 12B is a circuit diagram schematically illustrating a portion of the memory device of FIG. 12A, according to an exemplary embodiment of the inventive concept. In detail, FIG. 12A shows a side of layout of a memory device 120 including read circuits (124_1, 124_2, etc.), a calibration resistor circuit 125, a first conductive line CL121, and a second conductive line CL122, and FIG. 12B shows an equivalent circuit of a portion of the memory device 120.

Referring to FIG. 12A, the memory device 120 may be a semiconductor device manufactured by semiconductor processes and may include a front-end-of-line (FEOL) portion and a back-end-of-line (BEOL) portion. The first conductive line CL121 where a calibration current passes during a calibrate operation and the second conductive line CL122 where a reference current passes may be formed in a high-level wiring layer, which is relatively free from the influence of other patterns for signal routing. For example, as illustrated in FIG. 12A, the first conductive line CL121 and the second conductive line CL122 may be formed in an M4 metal layer. In exemplary embodiments of the inventive concept, the first conductive line CL121 and the second conductive line CL122 may be formed in a wiring layer that is at a higher or lower level than a wiring layer illustrated in FIG. 12A.

An element in an FEOL region may be connected to the first conductive line CL121 or the second conductive line CL122 of an M4 metal layer through a plurality of conductive patterns and a plurality of vias. For example, as illustrated in FIG. 12A, an element in an FEOL region of a first read circuit 124_1 may be connected to the first conductive line CL121 or the second conductive line CL122 through a via of a V0 via layer, a pattern of an M1 metal layer, a via of a V1 via layer, a pattern of an M2 metal layer, a via of a V2 via layer, a pattern of an M3 metal layer, and a via of a V3 via layer, and a second read circuit 124_2 and the calibration resistor circuit 125 may also be connected to the first conductive line CL121 and the second conductive line CL122 in a similar way. Patterns and vias between an FEOL element and a pattern of the M4 metal layer may be referred to as a via stack, and the via stack may have a resistance. In exemplary embodiments of the inventive concept, a via stack between the first conductive line CL121 or the second conductive line CL122 and a read circuit (e.g., 124_1) may have substantially the same structure as a via stack between the first conductive line CL121 or the second conductive line CL122 and the calibration resistor circuit 125. Accordingly, as illustrated in FIG. 12B, via stacks may each be modeled or represented as a via resistor R_VIA.

Referring to FIG. 12B, the first conductive line CL121 and the second conductive line CL122 may be connected to the read circuit (e.g., 124_1) or the calibration resistor circuit 125 through the via resistor R_VIA, and accordingly, a path including the first conductive line CL121 and a path including the second conductive line CL122 may include the same number of via resistors R_VIA. For example, during a calibrate operation of the first read circuit 124_1, while the calibration current $I_{CAL}$ may flow to the calibration resistor circuit 125 through the via resistor R_VIA, the first conductive line CL121, and the via resistor R_VIA, the reference current $I_{REF}$ may flow to the calibration resistor circuit 125 through the via resistor R_VIA, the second conductive line CL122, and the via resistor R_VIA. Accordingly, as described above, since the first conductive line CL121 and the second conductive line CL122 have substantially the same structure, resistances that the calibration current $I_{CAL}$ and the reference current $I_{REF}$ experience from the first read circuit 124_1 to the calibration resistor circuit 125 may match up.

Figure 13:
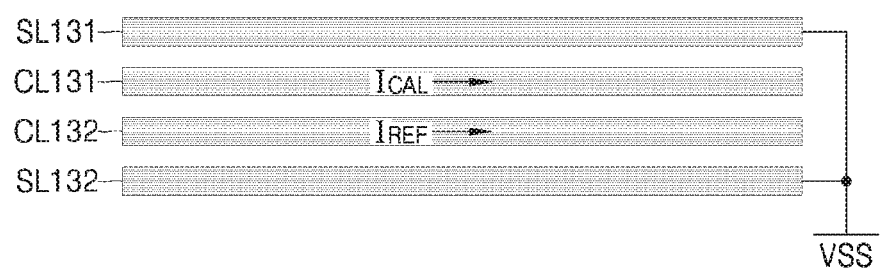
FIG. 13 is a diagram illustrating conductive lines according to an exemplary embodiment of the inventive concept.

FIG. 13 is a diagram illustrating conductive lines according to an exemplary embodiment of the inventive concept. In exemplary embodiments of the inventive concept, shield lines SL131 and SL132 may be arranged adjacent to a first conductive line CL131 and a second conductive line CL132 that the calibration current $I_{CAL}$ and the reference current $I_{REF}$ respectively pass through during a calibrate operation. For example, as illustrated in FIG. 13, the first shield line SL131 and the second shield line SL132, extending in the same wiring layer as the first conductive line CL131 and the second conductive line CL132, and parallel to the first conductive line CL131 and the second conductive line CL132 with the first conductive line CL131 and the second conductive line CL132 therebetween, may be arranged. The first shield line SL131 and the second shield line SL132 may reduce external noise influence on the first conductive line CL131 and the second conductive line CL132, and to this end, electrostatic potential, for example, the negative supply voltage VSS as illustrated in FIG. 13, may be applied to the first shield line SL131 and the second shield line SL132.

Figure 14:
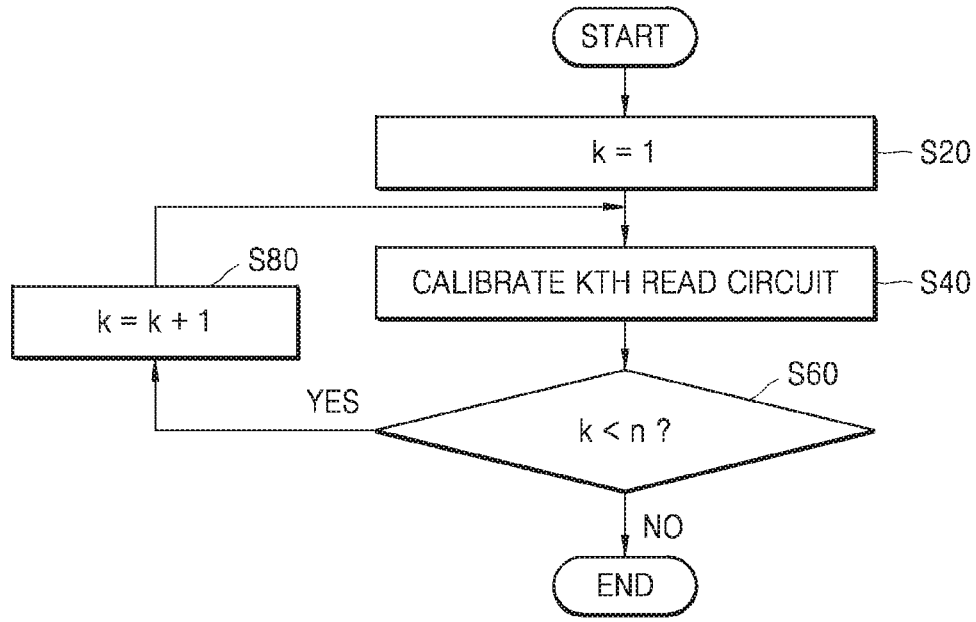
FIG. 14 is a flowchart illustrating a method of calibrating a reference in a memory device, according to an exemplary embodiment of the inventive concept.

FIG. 14 is a flowchart illustrating a method of calibrating a reference in a memory device, according to an exemplary embodiment of the inventive concept. Calibration of a reference in a memory device may refer to an operation of calibrating read circuits in the memory device or reference resistors included in the read circuits. For example, the method of FIG. 14 may be performed by the memory device 10 of FIG. 1, and FIG. 14 will be described with reference to FIG. 1.

Referring to FIG. 14, in operation S20, an initialization operation for reference calibration may be performed. For example, as illustrated in FIG. 14, a variable k may be set to 1, and the variable k may correspond to an index of each of n read circuits included in the read circuits 14.

In operation S40, an operation of calibrating a $k^{th}$ read circuit may be performed. As described above, the memory device 10 may include the first conductive line CL1 and the second conductive line CL2 extending across the read circuits 14, and during a calibrate operation of the read circuits 14, while the calibration current $I_{CAL}$ may flow through the first conductive line CL1, the reference current $I_{REF}$ may flow through the second conductive line CL2. Accordingly, each of the read circuits 14 may be uniformly calibrated, and read errors may be removed. An example of operation S40 is described below with reference to FIG. 15.

In operation S60, it may be determined whether the variable k is smaller than n or not. In other words, it may be determined whether calibration of the final $n^{th}$ read circuit from among the read circuits 14 is completed or not. When the variable k is smaller than n, e.g., when calibration still needs to be performed on at least one read circuit, the variable k may increase by 1 in operation S80, and operation S40 may be performed subsequently. In other words, the controller 16 of FIG. 1 may control respective switch sets to sequentially perform calibration of the reference resistors in the read circuits 14. On the other hand, when the variable k is not smaller than n (such as when the variable k matches n), e.g., when calibration of the read circuits 14 is completed, the calibration of reference may be finished.

In exemplary embodiments of the inventive concept, the method of FIG. 14 may be performed when power is supplied to the memory device 10. For example, when power is supplied to the memory device 10, the controller 16 may perform a calibrate operation by controlling the read circuits 14 and the calibration resistor circuit 15, and may control the read circuits 14 and the calibration resistor circuit 15 to perform operations according to an external command, for example, a read operation and/or a write operation, after completing the calibrate operation. In exemplary embodiments of the inventive concept, a calibration result of reference, e.g., resistances of reference resistors included in the read circuits 14, may be stored in a volatile memory element such as a register, synchronous random access memory (SRAM), etc.

In exemplary embodiments of the inventive concept, the method of FIG. 14 may be performed in response to a signal provided to the memory device 10. For example, the memory device 10 may externally receive a signal instructing calibration of reference, and the controller 16 may perform a calibrate operation by controlling the read circuits 14 and the calibration resistor circuit 15 in response to the received signal. In exemplary embodiments of the inventive concept, a calibration result of reference, e.g., resistances of reference resistors included in the read circuits 14, may be stored in a non-volatile memory element such as flash, anti-fuse, etc. The signal instructing calibration may be provided during manufacturing processes of the memory device 10, or alternatively, may be periodically or non-periodically provided by another device (e.g., 171 of FIG. 17) using the memory device 10.

Figure 15:
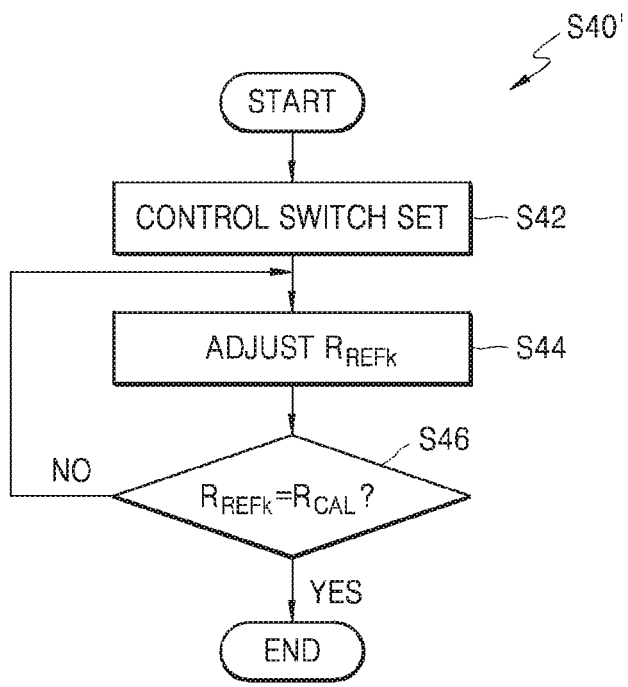
FIG. 15 is a flowchart illustrating an operation of calibrating a read circuit in the method of FIG. 14, according to an exemplary embodiment of the inventive concept.

FIG. 15 is a flowchart illustrating an operation of calibrating a read circuit in the method of IG. 14, according to an exemplary embodiment of the inventive concept. In other words, an example of operation S40 in FIG. 14 will be provided below. An operation of calibrating a $k^{th}$ read circuit may be performed in operation S40' of FIG. 15, and as illustrated in FIG. 15, operation S40' may include a plurality of operations S42, S44, and S46. For example, operation S40' of FIG. 15 may be performed by the controller 16 of FIG. 1 and the calibration circuit $CAL_k$ of FIG. 5B, and FIG. 15 will be hereinafter described with reference to FIGS. 1 and 5B.

In operation S42, an operation of controlling a switch set may be performed. As described above with reference to FIG. 8, etc., the read circuit 54_k may include a switch set including a plurality of switches, and the controller 16 may control the switch set included in the read circuit 54_k to configure the equivalent circuit of FIG. 5B.

In operation S44, an operation of adjusting the resistance $R_{REFk}$ of the reference resistor R_REF$_k$ may be performed. For example, the calibration circuit $CAL_k$ may increase or decrease the resistance $R_{REFk}$ of the reference resistor R_REF$_k$ through the adjustment signal ADJ$_k$. An example of operation S44 is described below with reference to FIG. 16.

In operation S46, an operation of determining whether the resistance $R_{REFk}$ of the reference resistor R_REF$_k$ matches the resistance $R_{CAL}$ of the calibration resistor R_CAL may be performed. For example, when the calibration circuit $CAL_k$ gradually increases the resistance $R_{REFk}$ of the reference resistor R_REF$_k$ through the adjustment signal ADJ$_k$, the calibration circuit $CAL_k$ may determine the resistance $R_{REFk}$ of the reference resistor R_REF$_k$ as matching the resistance $R_{CAL}$ of the calibration resistor R_CAL at a time when the output signal OUT$_k$ of the sense amplifier SA$_k$ transitions. When the resistance $R_{REFk}$ of the reference resistor R_REF$_k$ does not match the resistance $R_{CAL}$ of the calibration resistor R_CAL (S46: NO), e.g., when transition of the output signal OUT$_k$ does not occur, operation S44 may be performed again. On the other hand, when the resistance $R_{REFk}$ of the reference resistor R_REF$_k$ matches the resistance $R_{CAL}$ of the calibration resistor R_CAL (S46: YES), e.g., when transition of the output signal OUT$_k$ occurs, operation S40' may be finished.

Figure 16:
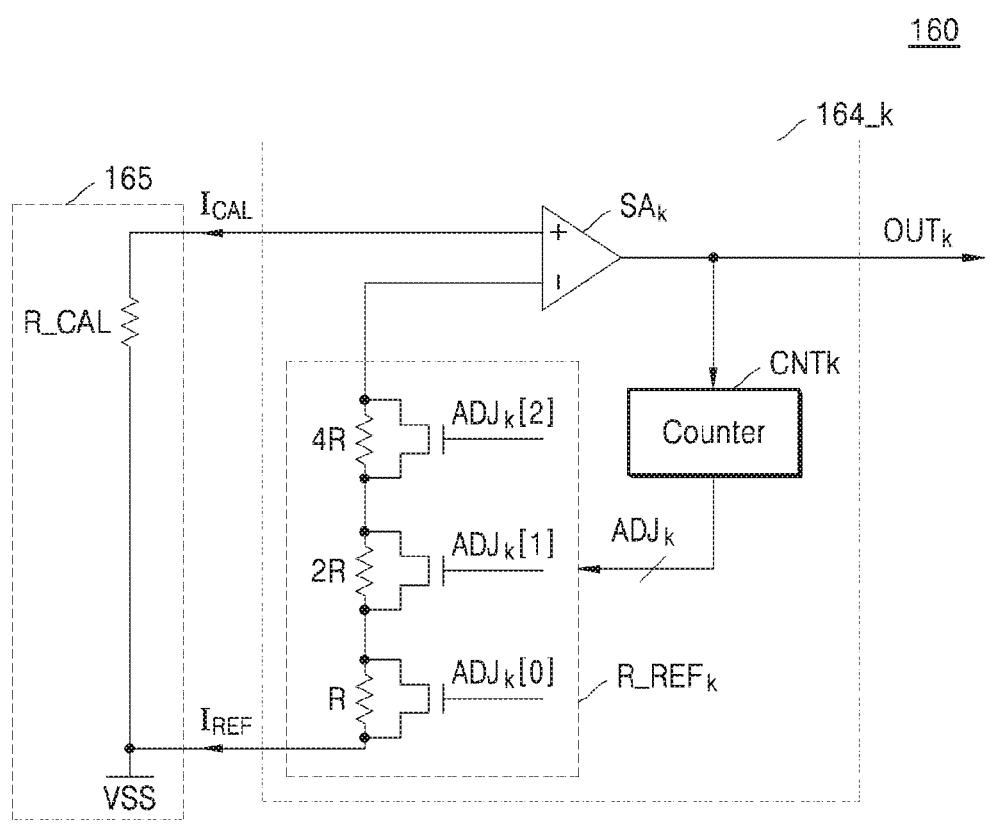
FIG. 16 is a circuit diagram illustrating a portion of a memory device according to an exemplary embodiment of the inventive concept.

FIG. 16 is a circuit diagram illustrating a portion of a memory device according to an exemplary embodiment of the inventive concept. In detail, FIG. 16 shows an equivalent circuit of a memory device 160 including a read circuit 164_k and a calibration resistor circuit 165 during a calibrate operation. As illustrated in FIG. 16, the read circuit 164_k may include the sense amplifier $SA_k$, a counter CNTk, and the reference resistor $R\_REF_k$, and the calibration resistor circuit 165 may include the calibration resistor R_CAL.

In exemplary embodiments of the inventive concept, the read circuit 164_k may include the counter CNTk as a calibration circuit. The counter CNTk may output the adjustment signal $ADJ_k$ having a gradually increasing or decreasing value, and the reference resistor $R\_REF_k$ may have the resistance $R_{REFk}$ increasing or decreasing according to a value of the adjustment signal $ADJ_k$. For example, as illustrated in FIG. 16, the reference resistor $R\_REF_k$ may include resistors respectively having resistances 4R, 2R, and R and connected in series and transistors respectively connected to the resistors in parallel, and may have a resistance that changes according to the adjustment signal $ADJ_k$ applied to gates of the transistors. A structure of the reference resistor $R\_REF_k$ illustrated in FIG. 16 is merely an example, and it will be understood that, in exemplary embodiments of the inventive concept, the reference resistor $R\_REF_k$ may have the structure of a variable resistance element which is different from the structure illustrated in FIG. 16.

At the start of the calibrate operation, the counter CNTk may be reset by the controller 16 of FIG. 1, and for example, may output the adjustment signal $ADJ_k$ having a gradually increasing value. When the output signal $OUT_k$ transitions, for example, when the sense amplifier $SA_k$ outputs an activated output signal $OUT_k$ indicating that the calibration current $I_{CAL}$ is greater than the reference current $I_{REF}$ (rather than an inactivated output signal $OUT_k$ indicating that the calibration current $I_{CAL}$ is less than the reference current $I_{REF}$), the counter CNTk may stop increasing a value of the adjustment signal $ADJ_k$ and may maintain the value of the adjustment signal $ADJ_k$.

Figure 17:
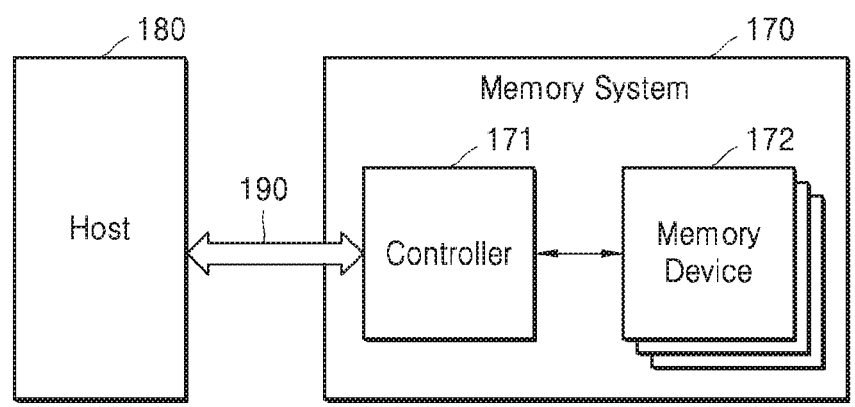
FIG. 17 is a block diagram illustrating a memory system including a memory device, according to an exemplary embodiment of the inventive concept.

FIG. 17 is a block diagram illustrating a memory system including a memory device, according to an exemplary embodiment of the inventive concept. As illustrated in FIG. 17, a memory system 170 may communicate with a host 180 and may include a controller 171 and a memory device 172.

An interface 190 where the memory system 170 and the host 180 communicate may use an electrical signal and/or an optical signal, and as non-limiting examples, may be realized as a serial advanced technology attachment (SATA) interface, a SATA express (SATAe) interface, a serial attached small computer system interface (serial attached SCSI (SAS)), a peripheral component interconnect express (PCIc) interface, a non-volatile memory express (NVMe) interface, an advanced host controller interface (AHCI), or a combination thereof.

In exemplary embodiments of the inventive concept, the memory system 170 may be removably combined with the host 180 to communicate with the host 180. As resistive memory, the memory device 172 may be non-volatile memory, and the memory system 170 may be referred to as a storage system. For example, the memory system 170, as non-limiting examples, may be realized as a solid-state drive or solid-state disk (SSD), an embedded SSD (eSSD), a multimedia card (MMC), an embedded multimedia card (eMMC), etc.

The controller 171 may control the memory device 172 in response to a request received from the host 180 through the interface 190. For example, the controller 171 may write data received together with a write request to the memory device 172 in response to the write request, and may provide data stored in the memory device 172 to the host 180 in response to a read request.

The memory system 170 may include at least one memory device 172, and the memory device 172 may include a memory cell having a variable resistance element and a reference cell. As described above, the memory device 172 may provide accurate reference calibration, and thus, a value stored in the memory cell may be accurately read despite changes in processes, voltage, temperature, etc. As a result, operation reliability of the memory system 170 may improve.

Figure 18:
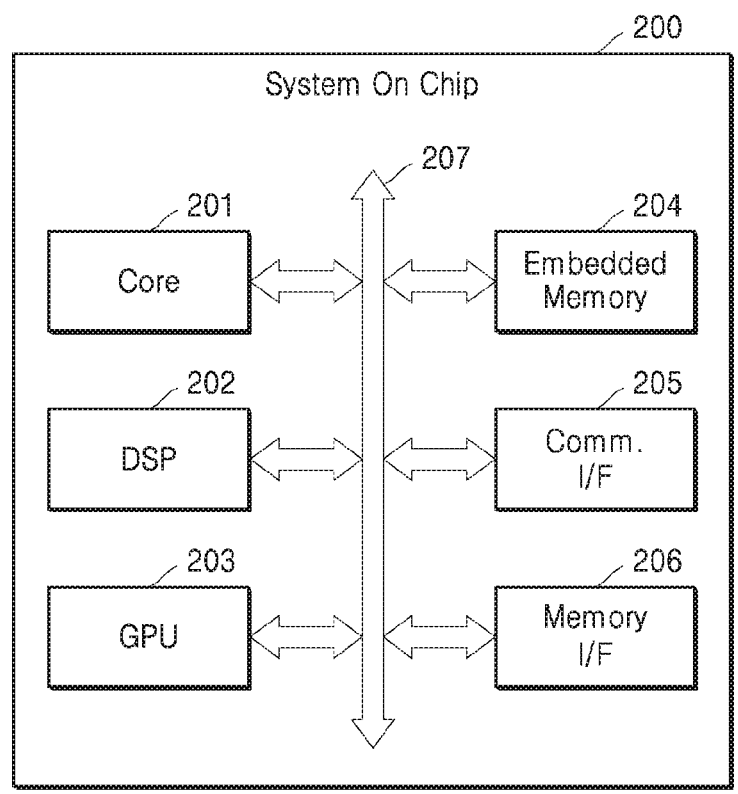
FIG. 18 is a block diagram illustrating a system on chip including a memory device, according to an exemplary embodiment of the inventive concept.

FIG. 18 is a block diagram illustrating a system on chip (SoC) including a memory device, according to an exemplary embodiment of the inventive concept. An SoC 200 may refer to an integrated circuit where components of a computing system or another electronic system are integrated. For example, as one of SoCs 200, an application processor (AP) may include a processor and components for other functions. As illustrated in FIG. 18, the SoC 200 may include a core 201, a digital signal processor (DSP) 202, a graphic processing unit (GPU) 203, embedded memory 204, a communication interface 205, and a memory interface 206. Components of the SoC 200 may communicate with one another through a bus 207.

The core 201 may process instructions and may control operations of components included in the SoC 200. For example, the core 201 may drive an operating system by processing a series of instructions and may execute applications on the operating system. The DSP 202 may generate useful data by processing a digital signal, for example, a digital signal provided from the communication interface 205. The GPU 203 may generate data for an image to be output through a display device from image data provided from the embedded memory 204 or the memory interface 206, and may encode image data. The communication interface 205 may provide a communication network or an interface for one-to-one communication. The memory interface 206 may provide an interface for external memory of the SoC 200, for example, dynamic random access memory (DRAM), flash memory, etc.

The embedded memory 204 may store data required for operations of the core 201, the DSP 202, and the GPU 203. The embedded memory 204 may include a resistive memory device according to an exemplary embodiment of the inventive concept, and accordingly, in the embedded memory 204, a value stored in a memory cell may be accurately read despite changes of processes, voltage, temperature, etc. As a result, operation reliability of the SoC 200 may improve.

While the inventive concept has been particularly shown and described with reference to exemplary embodiments thereof, it will be understood by those of ordinary skill in the art that various changes in form and details may be made thereto without departing from the spirit and scope of the inventive concept as set forth by the following claims.

What is claimed is:

1. A resistive memory device configured to calibrate a reference resistor, the resistive memory device comprising:
   a calibration resistor circuit comprising a calibration resistor;
   a first reference resistor;
   a first sense amplifier configured to compare input currents;
   a first switch set comprising a plurality of switches;

a first calibration circuit configured to adjust a variable resistance of the first reference resistor based on an output signal of the first sense amplifier; and a controller configured to control the first switch set to allow the first sense amplifier to compare a first reference current passing through the first reference resistor with a first read current passing through a first memory cell during a read operation and compare the first reference current with a first calibration current passing through the calibration resistor during a calibrate operation, wherein a path of the first reference current during the read operation is different from a path of the first reference current during the calibrate operation.

2. The resistive memory device of claim 1, further comprising:

a first conductive line comprising at least one portion configured to allow the first calibration current to pass therethrough and flow to the calibration resistor; and a second conductive line comprising at least one portion configured to allow the first reference current to pass therethrough from the first reference resistor during the calibrate operation, wherein the first conductive line and the second conductive line have substantially the same length.

3. The resistive memory device of claim 2, wherein the first conductive line and the second conductive line are disposed in the same wiring layer and extend substantially parallel to each other.

4. The resistive memory device of claim 3, further comprising shield lines extending in the same wiring layer as the first conductive line and the second conductive line and configured to allow electrostatic potential to be applied to the shield lines, wherein the first conductive line and the second conductive line are disposed between the shield lines.

5. The resistive memory device of claim 2, wherein the first switch set comprises:

a first switch connected to the first reference resistor and configured to provide ground potential to the first reference resistor while turned on; and a second switch configured to electrically connect the first reference resistor and the second conductive line while turned on, wherein the controller is configured to turn on the first switch and turn off the second switch during the read operation, and configured to turn off the first switch and turn on the second switch during the calibrate operation.

6. The resistive memory device of claim 5, wherein the calibration resistor circuit further comprises a first compensation switch having substantially the same structure as the second switch, and the first compensation switch is configured to allow the first calibration current to pass therethrough while turned on.

7. The resistive memory device of claim 6, wherein the calibration resistor circuit further comprises:

a second compensation switch configured to allow the first calibration current to pass therethrough while turned on, wherein the second compensation switch is disposed between the first conductive line and ground potential; and a third compensation switch configured to allow the first reference current to pass therethrough while turned on, wherein the third compensation switch is disposed between the second conductive line and the ground potential.

8. The resistive memory device of claim 1, wherein the first switch set comprises:

a third switch connected to a first input end of the first sense amplifier and configured to allow the first reference current to pass therethrough while turned on; and a fourth switch connected to a second input end of the first sense amplifier and configured to allow the first calibration current to pass therethrough while turned on.

9. The resistive memory device of claim 8, wherein the third switch has substantially the same structure as the fourth switch, and the controller is configured to turn on the third switch during the read operation and the calibrate operation.

10. The resistive memory device of claim 1, further comprising:

a second reference resistor having a variable resistance;

a second sense amplifier configured to compare input currents; and a second switch set comprising a plurality of switches, wherein the controller is further configured to control the second switch set to allow the second sense amplifier to compare a second reference current passing through the second reference resistor with a second read current passing through a second memory cell during the read operation and compare the second reference current with the first calibration current during the calibrate operation, wherein a path of the second reference current during the read operation is different from a path of the second reference current during the calibrate operation.

11. The resistive memory device of claim 10, wherein the controller is further configured to control the first switch set and the second switch set to sequentially perform calibration of the first reference resistor and calibration of the second reference resistor.

12. The resistive memory device of claim 10, further comprising a second calibration circuit configured to adjust, based on an output signal of the second sense amplifier, a resistance of the second reference resistor.

13. The resistive memory device of claim 1, wherein the controller is further configured to perform the calibrate operation when power is supplied to the resistive memory device.

14. A resistive memory device configured to calibrate a plurality of reference resistors, the resistive memory device comprising:

a calibration resistor;

a plurality of reference resistors;

a plurality of sense amplifiers each configured to compare a reference current passing through one of the plurality of reference resistors with a read current passing through a memory cell during a read operation, and compare the reference current with a calibration current passing through the calibration resistor during a calibration operation;

a plurality of second switches configured to form a second path during a calibrate operation to allow the reference current to pass through the second path; and a plurality of first switches configured to form a first path across a row in which the sense amplifiers are arranged from one of the sense amplifiers to the calibration resistor through which the calibration current passes during the calibration operation, wherein the second path has substantially the same length as the first path.

15. The resistive memory device of claim 14, wherein the plurality of first switches are respectively connected to the plurality of reference resistors and configured to provide ground potential to the plurality of reference resistors during the read operation; and wherein the plurality of second switches each configured to form the second path during the calibrate operation.

16. The resistive memory device of claim 14, further comprising:

a first conductive line comprising at least one portion included in the first path; and a second conductive line comprising at least one portion included in the second path, wherein the first conductive line and the second conductive line are disposed in the same wiring layer and extend substantially parallel to each other.

17. A resistive memory device configured to calibrate a plurality of reference resistors, the resistive memory device comprising:

a calibration resistor;

a plurality of read circuits each configured to compare a reference current passing through one of a plurality of reference resistors with a read current passing through a memory cell during a read operation, and compare the reference current with a calibration current passing through the calibration resistor during a calibrate operation;

a first conductive line connected to the plurality of read circuits and the calibration resistor, and configured to allow the calibration current to pass therethrough during the calibrate operation; and a second conductive line connected to the plurality of read circuits, and configured to allow the reference current to pass therethrough during the calibrate operation, wherein the first conductive line crosses a row in which the read circuits are arranged, wherein the first conductive line and the second conductive line have substantially the same length as each other.

18. The resistive memory device of claim 17, wherein the first conductive line and the second conductive line are electrically disconnected from the plurality of read circuits during the read operation.

* * * * *